US006566692B2

(12) United States Patent
Uenoyama et al.

(10) Patent No.: US 6,566,692 B2
(45) Date of Patent: May 20, 2003

(54) ELECTRON DEVICE AND JUNCTION TRANSISTOR

(75) Inventors: Takeshi Uenoyama, Kyotanabe (JP); Masahiro Deguchi, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/924,920

(22) Filed: Aug. 8, 2001

(65) Prior Publication Data

US 2002/0027236 A1 Mar. 7, 2002

(30) Foreign Application Priority Data

Aug. 11, 2000 (JP) ....................................... 2000-243840
Aug. 11, 2000 (JP) ....................................... 2000-243844

(51) Int. Cl.[7] ..................... H01L 31/072; H01L 31/109; H01L 31/0328; H01L 31/0336; H01L 35/26

(52) U.S. Cl. ......................... 257/191; 257/10; 257/101; 257/103; 257/256; 438/20; 438/22; 438/48

(58) Field of Search .......................... 257/10, 256, 212, 257/87, 191–192, 101, 103; 438/20, 22, 48

(56) References Cited

U.S. PATENT DOCUMENTS 5,468,972 A * 11/1995 Yamada ....................... 257/10
5,521,404 A * 5/1996 Kikkawa et al. ............ 257/194
5,773,920 A * 6/1998 Shaw et al. ................. 257/103
6,064,082 A * 5/2000 Kawai et al. ............... 257/191
6,350,999 B1 * 2/2002 Uenoyama et al. ......... 257/191

OTHER PUBLICATIONS

Shaw, J.L.; "Graded Electron Affinity Electron Source"; American Vacuum Society 1996; J. Vac. Sci. Technol. B. 14(3); May/Jun. 1996; pp. 2072–2079.

* cited by examiner

*Primary Examiner*—David Nelms
*Assistant Examiner*—Andy Huynh
(74) *Attorney, Agent, or Firm*—Harness, Dickey & Pierce, PLC

(57) ABSTRACT

An n-GaN layer is provided as an emitter layer for supplying electrons. A non-doped (intrinsic) $Al_xGa_{1-x}N$ layer ($0 \leqq x \leqq 1$) having a compositionally graded Al content ratio x is provided as an electron transfer layer for transferring electrons toward the surface. A non-doped AlN layer having a negative electron affinity (NEA) is provided as a surface layer. Above the AlN layer, a control electrode and a collecting electrode are provided. An insulating layer formed of a material having a larger electron affinity than that of the AlN layer is interposed between the control electrode and the collecting electrode. This provides a junction transistor which allows electrons injected from the AlN layer to conduct through the conduction band of the insulating layer and then reach the collecting electrode.

16 Claims, 20 Drawing Sheets

ELECTRON DEVICE AND JUNCTION TRANSISTOR

BACKGROUND OF THE INVENTION

The present invention relates to an electron device which functions as a high-output power transistor employed, for example, in base stations for mobile radios.

In the past, electron emissive elements had a structure provided by the hot cathode method (or an electron gun method). The electron emissive element is provided with a cathode formed of a material having a high melting point such as tungsten (W) and an anode spaced opposite to the cathode. The cathode is heated to high temperatures to launch hot electrons from the solid into a vacuum. Also available is a so-called NEA emissive element which the inventors suggest to replace those employing the hot cathode method. The NEA electron emissive element employs a semiconductor material or an insulating material having a negative electron affinity (NEA). Described below is the principle of an electron device that functions as an electron emissive element (hereinafter referred to as the NEA electron device).

FIG. 1 is a perspective view illustrating the structure of a prior-art NEA electron device that employs aluminum nitride (AlN) as an example of a NEA material. As shown in FIG. 1, the NEA electron device includes an electron supplying layer 101 for supplying electrons and an electron transport layer 102 for transporting the electrons supplied from the electron supplying layer 101 toward the solid surface side. The NEA electron device also includes a surface layer 103 formed of a NEA material and a surface electrode 104 used for the application of a voltage to allow electrons to travel from the electron supplying layer 101 to the surface layer 103.

In this example, the electron supplying layer 101 is formed of an n-type GaN (n-GaN), and the electron transport layer 102 for allowing electrons to travel smoothly from the electron supplying layer 101 to the surface layer 103 is formed of non-doped $Al_xGa_{1-x}N$ (where x is a variable increasing in general continuously from 0 to 1) having a graded composition with an Al content ratio x varying continuously. The surface layer 103 is formed of AlN which is an intrinsic NEA material, and the surface electrode is formed of a metal such as platinum (Pt).

Now, described below are the electron affinity that is significant to the basic characteristics of this element and the structure of the electron transport layer that is required for smooth transportation of electrons.

1. Electron Affinity

The "electron affinity" in a semiconductor material is defined as the energy required to launch an electron present on the conduction band edge into a vacuum and unique to the material. Now, described below is the concept of "negative electron affinity (NEA)".

FIGS. 2(*a*) and (*b*) are energy band diagrams of semiconductor materials having a negative and positive electron affinity, illustrating the respective energy states. As shown in FIG. 2(*b*), the electron affinity $\chi=E_{vac}-E_c>0$ in a typical semiconductor, where $E_f$ is the Fermi level of the semiconductor, $E_c$ is the energy level of the conduction band edge, $E_v$ is the energy level of the valence band edge, $E_g$ is the bandgap, and $E_{vac}$ is the vacuum level. That is, the semiconductor has a positive electron affinity. In contrast, for some types of semiconductors, $\chi=E_{vac}-E_c<0$ as shown in FIG. 2(*a*). That is, semiconductors such as AlN have a negative electron affinity.

Now, consider a semiconductor having a positive electron affinity as shown in FIG. 2(*b*). In this case, to launch an electron present on the conduction band edge into a vacuum, the presence of the energy barrier of a magnitude of $\chi$ requires to give the amount of energy to the electron. For electron emission, it is therefore necessary in general to give an energy to an electron by heating or to allow an electron to tunnel the energy barrier by application of a high electric field.

On the other hand, consider a semiconductor having a negative electron affinity as shown in FIG. 2(*a*). In this case, absence of energy barrier allows an electron present on the conduction band edge of the surface to be easily emitted into a vacuum. In other words, no additional energy is required to launch the electron present on the semiconductor surface into a vacuum.

2. Electron Transport Layer

It is conceivably effective in efficient electron emission to employ, as the surface layer of an electron device for emitting the electron, a material having a substantially zero or negative electron affinity like the one mentioned above. However, no electron is present in general on the conduction band of a NEA material in an equilibrium state. Therefore, it is necessary to efficiently supply electrons in some way to the surface layer formed of a material that allows electrons to be emitted easily.

As shown in FIG. 1, the inventors have suggested a structural example. The structure has an intermediate layer (the electron transport layer 102) having gradually decreasing values of electron affinity to effectively supply electrons from the electron supplying layer 101 (a positive electron affinity), having a number of electrons therein, to the surface layer 103 in a NEA state (a negative electron affinity).

FIGS. 3(*a*) and (*b*) are energy band diagrams of the structural example of FIG. 1, provided when no voltage is applied between the electron supplying layer 101 and the surface electrode 104 (an equilibrium state) and a forward bias V is applied therebetween. Here, the structure includes the electron supplying layer 101, the electron transport layer 102, the surface layer 103, and the surface electrode 104. As mentioned above, the electron transport layer 102 is selected from materials that gradually decrease in electron affinity $\chi$ toward the surface.

In the equilibrium state shown in FIG. 3(*a*), there exist a number of electrons in the conduction band of the electron supplying layer 101. However, the high energy level of the conduction band edge of the surface layer 103 prevents the electrons from reaching the outermost surface on the other hand, when a forward bias is applied to such a structure (a positive voltage to the surface electrode side), the energy band is bent as shown in FIG. 3(*b*). As a result, the gradients of the concentration and the potential cause electrons present in the electron supplying layer 101 to travel toward the surface layer 103. In other words, an electron current flows. In addition, the electron transport layer 102 or ($Al_xGa_{1-x}N$) and the surface layer 103 or (AlN) are non-doped. Accordingly, the electrons injected from the electron supplying layer 101 to the electron transport layer 102 and the surface layer 103 can travel without being captured by recombination with holes or the like. Furthermore, the electron transport layer 102 is continuously graded in composition and thereby no energy barrier, which prevents electrons from traveling, is formed on the conduction band edge. Thus, this is advantageous in that electrons are efficiently transported to the surface.

As described above, the compositionally graded $Al_xGa_{1-x}N$ layer is employed as the electron transport layer 102. This allows electrons to efficiently travel from the n-GaN layer having a positive electron affinity to the surface layer 103 (AlN layer) having a negative electron affinity. Then, since the surface layer is in a NEA state, the electrons injected to the electron transport layer 102 and the surface layer 103 can pass easily through the surface electrode 104 to be emitted outwardly into a vacuum or the like.

However, such a phenomenon was also observed in the NEA electron device employing the structure shown in FIG. 1 that the application of a predetermined voltage to the surface electrode 104 would not serve to provide the expected amount of electrons.

A diagnosis of the cause of the phenomenon showed that defects such as fine cracks had occurred in the $Al_xGa_{1-x}N$ layer that constituted the electron transport layer 102 and the surface layer 103. That is, the composition of the $Al_xGa_{1-x}N$ layer is largely varied to provide significant variations in the bandgap of the electron transport layer 102. This has conceivably caused stress to occur due to variations in lattice constant, resulting in fine cracks. The electrons flowing through the defected portions such as cracks are not supplied to the portion of the surface layer being in the NEA state but flow out to the surface electrode 104 as leakage current. Consequently, this provides a less amount of electrons that pass though the surface electrode 104 to be emitted outwardly and whereby such a problem has been presumably raised that the efficiency of electron emission is lowered.

Incidentally, high-output power transistors, employed in base stations for mobile telephones or employed for wireless LANs, for use with high-frequency signals are conventionally composed of MESFETs or bipolar transistors making use of a GaAs substrate. These elements have advantages of having trackability for high-frequency signals provided by high-mobility electrons in the GaAs substrate and a high breakdown voltage provided by GaAs that has a larger bandgap than Si.

However, conventional MESFETs or bipolar transistors have a breakdown voltage that is defined by a depletion layer produced upon application of a voltage between the gate and the drain or between the base and the collector. This prevents the MESFETs or bipolar transistors from providing breakdown voltages that exceed the limit defined by the physical property of the semiconductor material (GaAs). For example, it is difficult to operate the existing power transistor at voltages of 30V or greater. For this reason, it is necessary to increase the amount of current in order to provide high output (high power). However, there is a drawback that an increase in current would cause an increase in power loss in comparison with an increase in voltage.

SUMMARY OF THE INVENTION

It is therefore a first object of the present invention to provide an electron device which is provided with means for preventing leakage current caused by defects such as a crack on the electron transport layer or the surface layer and thereby provides a high efficiency of electron emission.

A second object of the present invention is to make use of electrons that can pass through the conduction band not by tunneling but by conduction to utilize the insulating property, which is intrinsically given to insulators, thereby realizing a junction transistor that can function as a high-output power transistor having a high withstand voltage.

An electron device according to the present invention includes an electron supplying layer and an electron transport layer provided on the electron supplying layer and modulated so that an electron affinity is reduced from the electron supplying layer to a surface layer. The electron device also includes a surface layer provided on the electron transport layer and formed of a material having an electron affinity being negative or close to zero, and a surface electrode for applying a voltage to the electron supplying layer to allow electrons to travel from the electron supplying layer to an outermost surface of the surface layer via the electron transport layer. The electron device further includes a filter layer, disposed between the surface layer and the surface electrode, functioning as a barrier for preventing part of electrons from traveling to the surface electrode, and having an electron affinity equal to or larger than that of the surface layer.

For defects such as cracks present in the electron transport layer, this allows the filter layer disposed between the surface layer and the surface electrode to function as a barrier for preventing electrons from traveling which do not reach a NEA state portion in the surface layer, thereby preventing leakage current from flowing into the surface electrode. In addition, since the electron affinity of the filter layer is larger than that of the surface layer, the filter layer will not serve as a barrier for preventing electrons from traveling which have an energy level equal to or greater than that of the conduction band edge of the surface layer. Accordingly, the presence of the filter layer serves to prevent only the leakage current and emit electrons effectively from the surface layer in response to a voltage applied between the surface electrode and the electron supplying layer.

At least part of the electron transport layer has a bandgap that expands continuously in general from the electron supplying layer to the surface layer and whereby electrons travel preferably smoothly through the electron transport layer.

It is preferable that a region containing the electron transport layer and the surface layer is formed of $Al_xGa_{1-x}N$ ($0 \leqq x \leqq 1$) varying so as to increase the ratio of Al toward the outermost surface.

In this case, it is preferable that the electron transport layer has an Al content ratio x which increases continuously in general from 0 to 0.65 or greater from one end adjacent the electron supplying layer to the other end adjacent the surface layer.

In addition, it is preferable that carrier impurities are not doped in the electron transport layer.

The surface layer is formed of $Al_xGa_{1-x}N$ ($0.65 \leqq x \leqq 1$) and whereby a negative electron affinity state can be realized easily on the surface thereof. Accordingly, this is preferable in that such an element can be obtained that has a high efficiency of electron emission.

The filter layer is preferably formed of an insulating material having a positive electron affinity. It is also preferable that the filter layer contains at least any one of aluminum oxide ($Al_2O_3$), silicon oxide ($SiO_x$), and silicon nitride ($SiN_x$). It is further preferable that the filter layer contains at least any one of aluminum nitride (AlN), a mixed crystal semiconductor of gallium nitride—aluminum nitride ($Al_xGa_{1-x}N$) ($0.65 \leqq x \leqq 1$), and oxides of these materials.

The electron device further includes the collecting electrode, disposed above and spaced from the surface electrode, for accelerating and controlling electrons emitted outwardly from the surface layer. This is preferable in that mechanisms can be integrated for accelerating and collecting a current of electrons emitted from the surface of the electrode layer by the application of a voltage. That is, the integrated structure of the collecting electrode layer for collecting electrons emitted by applying a voltage between the electron supplying layer and the electrode layer makes it possible to fabricate a compact and high-density electron device that can perform signal amplification and switching operation. The element includes the electron supplying layer/electron transport layer/surface layer/electrode layer, which readily emits electrons as described above, and is adapted to accelerate emitted electrons. This provides advantages of being high in breakdown voltage, low in internal loss, and capable of low voltage drive.

A sealing member is further provided which maintains in a reduced pressure state between the electrode layer and the collecting electrode layer. This allows electrons to be accelerated at high speeds in a vacuum and collected by the collecting electrode, thereby providing a high switching function.

An insulating layer may be further provided which is disposed between the electrode layer and the collecting electrode.

Further provided is a buried layer for confining a region of electrons flowing through the electron transport layer into part of a cross section of the electron transport layer. This allows the current to be condensed, thereby making it possible to increase the efficiency of electron emission from the surface layer.

A junction transistor according to the present invention includes an emitter layer for supplying electrons, an electron transfer layer provided on the emitter layer and adapted to allow supplied electrons to travel therethrough, and a control electrode for applying a voltage to control the amount of electron supply from the emitter layer to the electron transfer layer. The junction transistor also includes a collecting electrode for collecting at least part of electrons supplied from the emitter layer, and an insulating layer interposed between the control electrode and the collecting electrode and having an electron affinity equal to or larger than that of an end portion of the electron transfer layer adjacent the control electrode. The junction transistor is adapted that electrons injected from the electron transfer layer to the insulating layer are adapted to conduct through a conduction band of the insulating layer to reach the collecting electrode.

When a voltage is applied between the control electrode and the emitter layer, this allows electrons to pass through the electron transfer layer from the electron supplying layer and to be then injected from the surface of the electron transfer layer. At this time, since the electron affinity of the insulating layer is larger than that of the outermost surface portion of the electron transfer layer, the injected electrons are allowed to conduct through the conduction band of the insulating layer to reach the collecting electrode. In addition, the insulating layer is interposed between the control electrode and the collecting electrode, thereby making it possible to provide a high breakdown voltage between the collecting electrode and the control electrode. Accordingly, such a junction transistor is obtained which can employ a high voltage to function as a high-output power transistor with low power loss.

The electron affinity of the electron transfer layer is adjusted to be made smaller from the emitter layer toward the control electrode, thereby facilitating injection of electrons into the insulating layer.

The electron transfer layer has a bandgap expanding from the emitter layer to the control electrode and the electron affinity is whereby preferably controlled.

The emitter layer and the electron transfer layer contain a layer formed of nitride, thereby making it easier to reduce the electron affinity as small as possible.

The electron transfer layer is formed of $Al_xGa_{1-x}N$ ($0 \leqq x \leqq 1$) varying so as to increase the ratio of Al toward the outermost surface. This allows a negative electron affinity state to be easily realized on the surface and is preferable in that such an element can be obtained which has a high efficiency of electron injection.

The insulating layer preferably contains at least any one of aluminum oxide ($Al_2O_3$), silicon oxide ($SiO_x$), and silicon nitride ($SiN_x$). It is also preferable that the insulating layer contains at least any one of AlN, $Al_xGa_{1-x}N$ ($0.65 \leqq x \leqq 1$), and oxides of these materials.

It is preferable that the junction transistor further includes a surface layer disposed between the electron transfer layer and the control electrode and formed of a material having an electron affinity being negative or close to zero.

The junction transistor further includes a filter layer, disposed between the electron transfer layer and the control electrode, functioning as a barrier for preventing electrons from traveling to the control electrode, and having an electron affinity equal to or larger than that of the control electrode. This makes it possible to prevent a leakage current from flowing from the electron transfer layer to the control electrode.

The junction transistor further includes a buried layer for confining a region of electrons flowing in the electron transfer layer to part of a cross section of the electron transfer layer. This allows the current to be condensed to whereby increase the efficiency of electron injection.

It is preferable that the control electrode is disposed across an electron current flowing from the emitter layer to the collecting electrode.

DETAILED DESCRIPTION OF THE INVENTION

Figure 1:
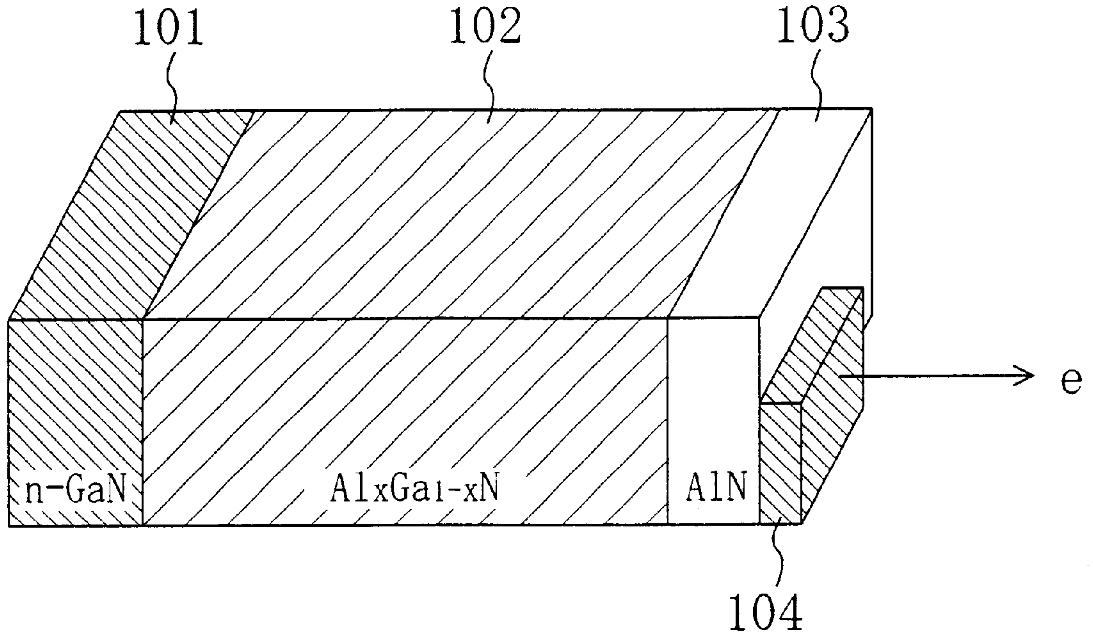
Fig. 1 PRIOR ART
FIG. 1 is a perspective view illustrating the structure of a prior-art NEA electron device that employs aluminum nitride (AlN) as an example of a NEA material.

Hereinafter, preferred embodiments of the present invention will be described with reference to the accompanying drawings, in which the same reference numerals denotes the same components throughout the following embodiments.

Embodiment 1

An NEA electron device is described below which uses a material having a negative electron affinity (NEA), like the aforementioned conventional NEA electron device, in accordance with a first embodiment of the present invention. The meaning of the negative electron affinity and the principle of the NEA electron device are the same as those described with reference to the aforementioned prior art.

Figure 4:
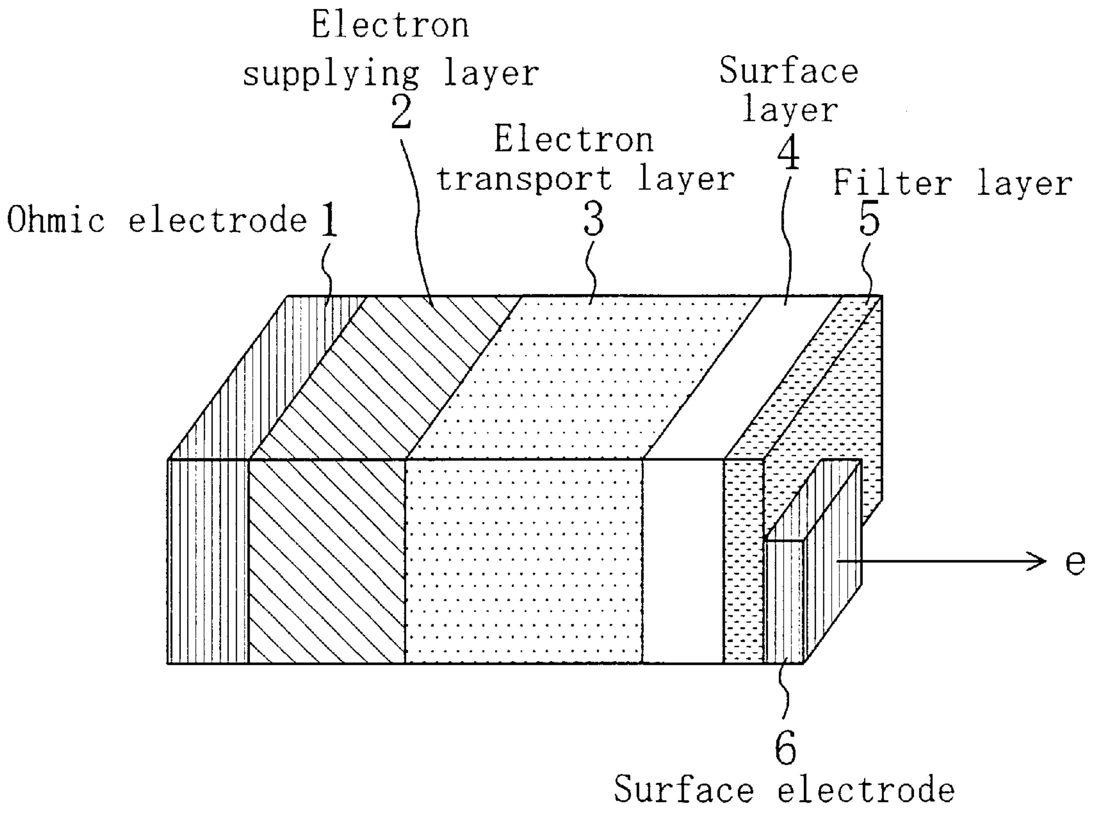
FIG. 4 is a perspective view illustrating the basic structure of a NEA electron device according to the present invention.

FIG. 4 is a perspective view illustrating the basic structure of a NEA electron device according to the first embodiment of the present invention. The NEA electron device according to the present invention includes an ohmic electrode 1, an electron supplying layer 2 for supplying electrons and an electron transport layer 3 for transporting the electrons supplied from the electron supplying layer 2 toward the solid surface side. The NEA electron device also includes a surface layer 4 formed of a NEA material and a surface electrode 6 used for the application of a voltage to allow electrons to travel from the electron supplying layer 2 to the surface layer 4. In principle, this structure is the same as that of the prior-art NEA electron emissive element shown in FIG. 1.

Unlike the prior-art NEA electron device, the electron device of the present invention features a filter layer 5, disposed between the surface layer 4 and the surface electrode 6, for preventing part of electrons from flowing toward the surface electrode 6.

Now, the materials forming each of the aforementioned portions are described below. The aforementioned electron supplying layer 2 is formed, for example, of n-type GaN (n-GaN). The electron transport layer 3 for transporting electrons from the electron supplying layer 2 to the surface layer 4 is formed of non-doped $Al_xGa_{1-x}N$ having a graded composition with Al content ratio x varying continuously (where x is a variable which increases in general continuously from 0 to 1). The surface layer 4 is formed of AlN or an intrinsic NEA material, and the surface electrode 6 is formed of a metal such as platinum (Pt). In addition, the aforementioned filter layer 5 is formed of aluminum oxide (alumina $Al_2O_3$). On the other hand, the surface electrode 6 is formed of a metal such as platinum (Pt).

Figure 5:
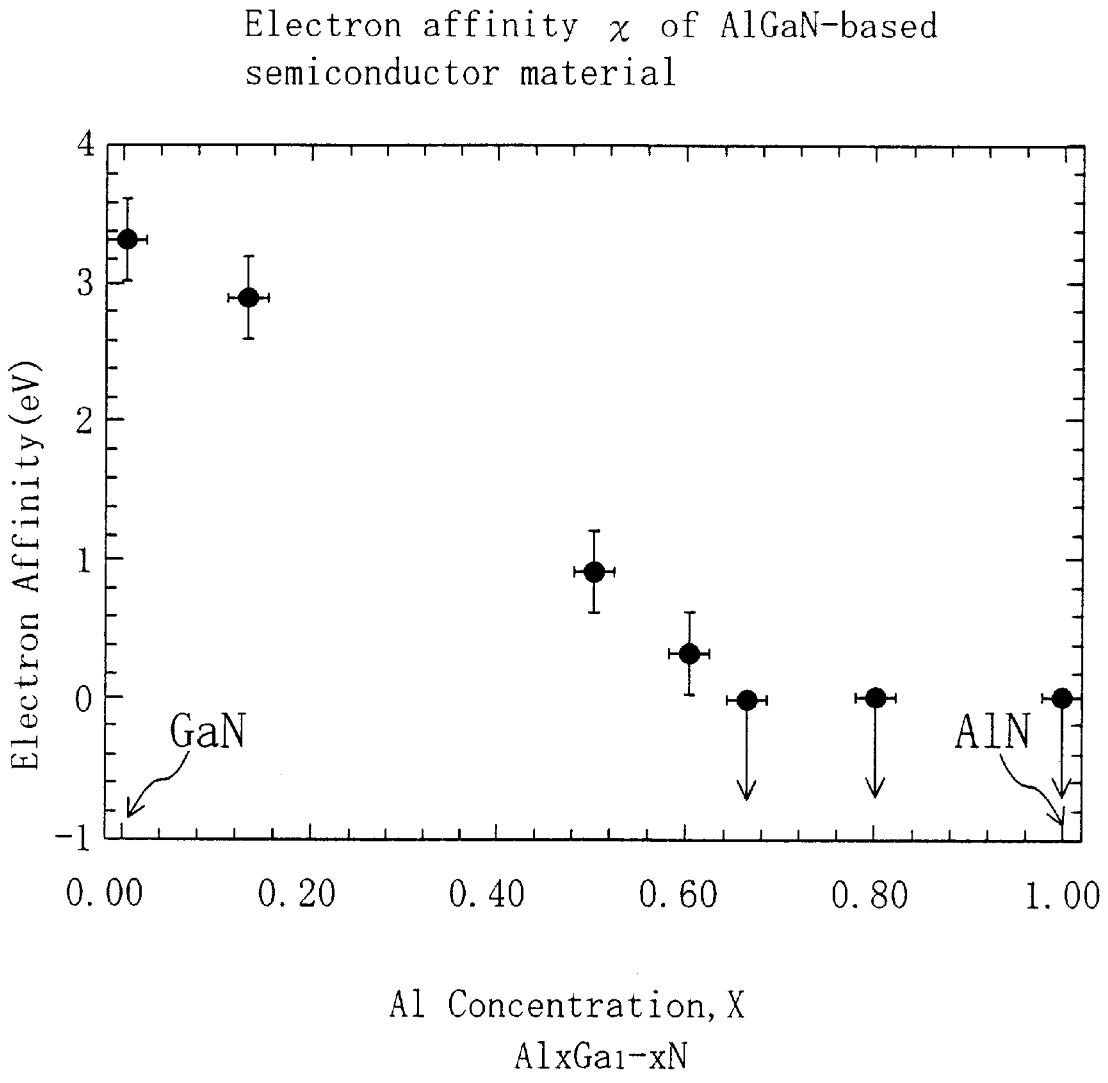
FIG. 5 is a view illustrating measured data of the electron affinity of an $Al_xGa_{1-x}N$-based semiconductor material.

FIG. 5 is a view illustrating measured data of the electron affinity of an $Al_xGa_{1-x}N$-based semiconductor material. In the figure, the horizontal axis represents the Al content ratio x in $Al_xGa_{1-x}N$. Here, the Al content ratio x indicates not the ratio of Al content to the entire $Al_xGa_{1-x}N$ but the ratio of Al to the Ga and Al content in the $Al_xGa_{1-x}N$. This holds true throughout this specification. Referring to the figure, at x=0, GaN has an electron affinity of about 3.3 eV, showing a positive electron affinity. However, it can be found that as the Al content ratio x increases, the electron affinity decreases and becomes generally zero or negative in the region of x>0.65. Accordingly, AlN at x=1 has a negative electron affinity. In other words, like this electron device, the electron supplying layer 2 is formed of n-type GaN (n-GaN), the electron transport layer 3 is formed of non-doped $Al_xGa_{1-x}N$ having a graded composition with Al content ratio x varying continuously, and the surface layer 4 is formed of AlN or an intrinsic NEA material. This provides a successively expanded bandgap from the electron supplying layer 2 to the surface layer 4, thereby easily realizing a structure in which the electron affinity is successively reduced.

Figure 6A:
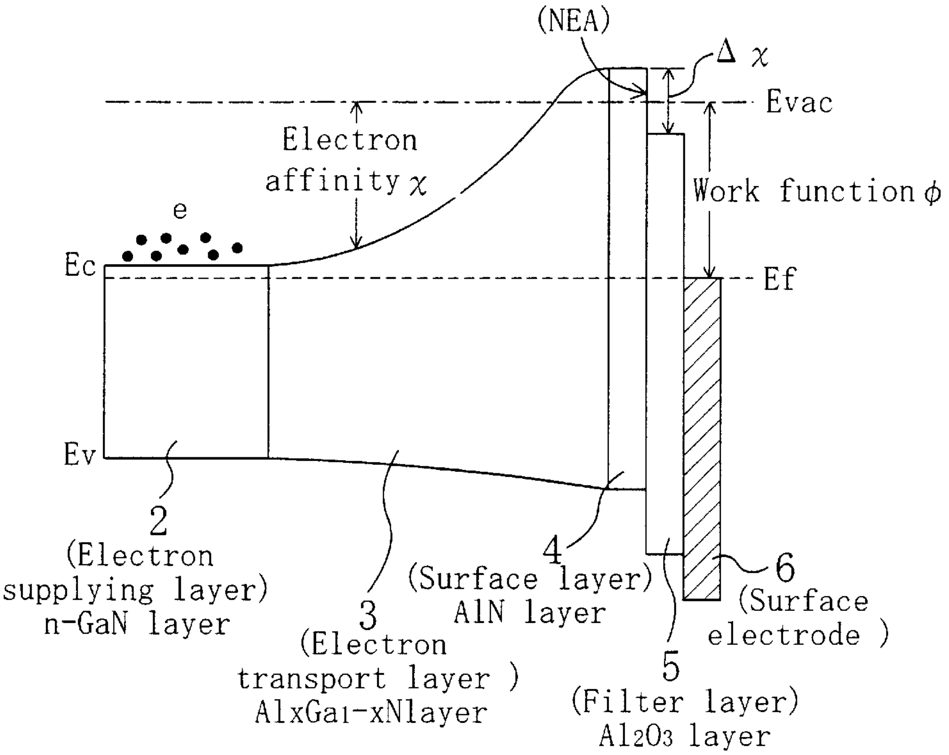
FIGS. 6(*a*) and 6(*b*) are energy band diagrams of a basic arrangement according to the present invention, illustrating a non-biased state (an equilibrium state) and a forward-biased state (the forward bias is V), respectively.
Figure 6B:
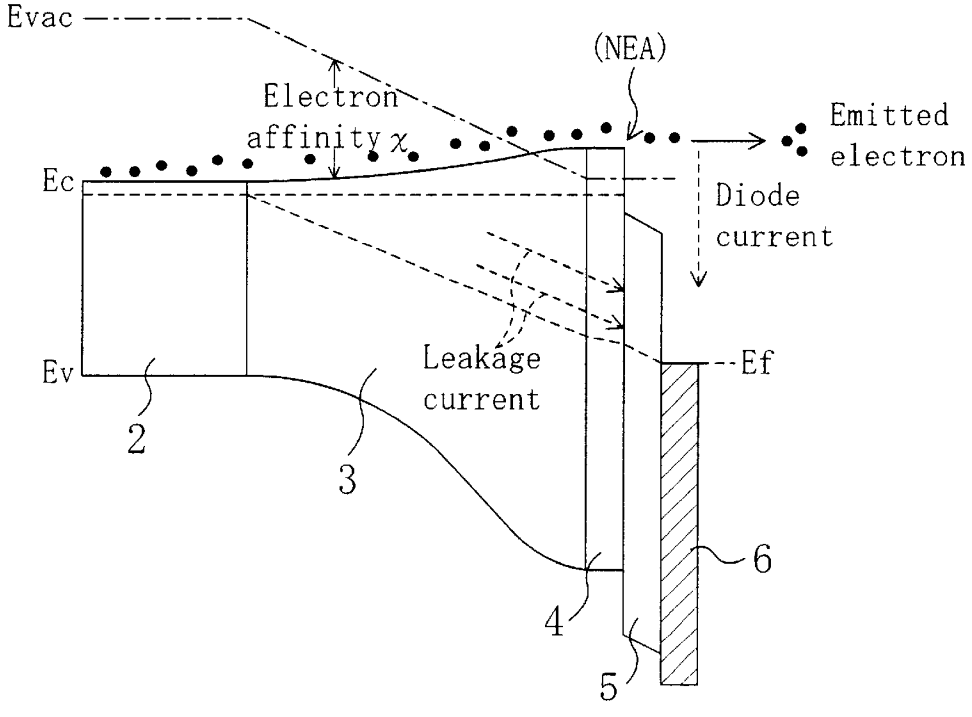

FIGS. 6(*a*) and (*b*) are energy band diagrams of the structural example of FIG. 4, provided when no voltage is applied between the electron supplying layer 2 and the surface electrode 6 (an equilibrium state) and a forward bias V is applied therebetween. Here, the structure includes the electron supplying layer 2, the electron transport layer 3, the surface layer 4, the filter layer 5, and the surface electrode 6. As shown in FIG. 6(*a*), the electron transport layer 3 is selected from materials that provide an electron affinity $\chi$ that is gradually reduced toward the surface. Proper selection of a material and variations in composition ratio of the material will make it possible to realize a structure in which the electron affinity is continuously reduced in general.

This structural example employs an n-doped GaN layer (with a carrier density of up to $4\times10^{18}/cm^3$) as the electron supplying layer 2, a non-doped $Al_xGa_{1-x}N$ layer ($0 \leqq x \leqq 1$) having a graded composition as the electron transport layer 3, and an AlN layer as the surface layer 4. The electron transport layer 3 formed of the compositionally graded $Al_xGa_{1-x}N$ contains no Al at x=0 in the portion in contact with the GaN layer acting as the electron supplying layer 2 and no Ga at x=1 in the portion in contact with the AlN acting as the electron transport layer 3. In the portion therebetween, the value of x is gradually increased, that is, the composition is graded so that the Al content increases toward the surface. As shown in FIG. 6(*a*), such a structure as described above provides the electron transport layer 3 formed of $Al_xGa_{1-x}N$ having a positive electron affinity in the portion in contact with the electron supplying layer 2. However, the electron affinity is reduced as the Al content increases toward the surface and becomes negative, like the AlN, in the portion in contact with the surface layer 4 in the electron transport layer 3. Accordingly, the electron affinity of the electron transport layer 3 is continuously reduced in general from the electron supplying layer 2 to the surface layer 4.

Figure 7:
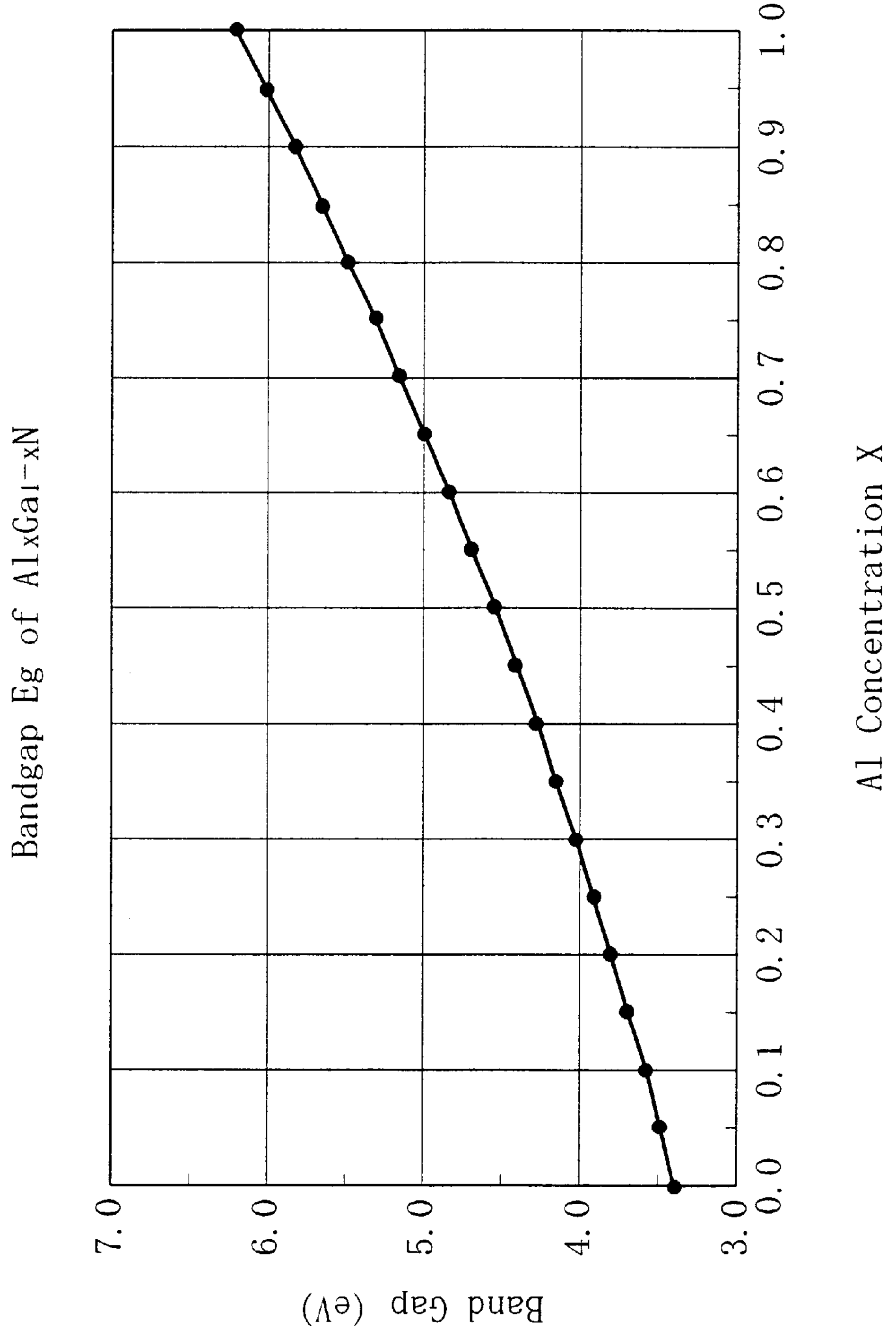
FIG. 7 is a view illustrating the dependency of the bandgap of $Al_xGa_{1-x}N$ ($0 \leqq x \leqq 1$) on the ratio of Al content.

For the electron transport layer 3 employing a compositionally graded $Al_xGa_{1-x}N$, it can be considered that the structure described above has a continuously expanding bandgap. FIG. 7 is a view illustrating the dependency of the bandgap of $Al_xGa_{1-x}N$ ($0 \leqq x \leqq 1$) on the Al content ratio. Referring to the figure, the horizontal axis represents the Al content ratio x and the vertical axis represents the bandgap $E_g$ (eV) for the composition. As shown in the figure, the $E_g$ of $Al_xGa_{1-x}N$ is not strictly linear against an increase in x but increases substantially linearly. That is, the $Al_xGa_{1-x}N$ layer forming the electron transport layer 3 has x=0 in the portion in contact with the GaN layer forming the electron supplying layer 2 and thus has the same bandgap ($E_g$=3.4 eV) as that of the GaN layer. The $Al_xGa_{1-x}N$ layer has x=1 in the portion in contact with the AlN layer forming the surface layer 4 and thus has the same bandgap ($E_g$=6.2 eV) as that of the AlN layer. In addition, in the region of the $Al_xGa_{1-x}N$ layer except for both ends, the value of x gradually increases, that is, the composition is graded so that the Al content increases gradually toward the surface. This allows the bandgap of the electron transport layer 3 to expand continuously in general from the electron supplying layer 2 to the surface layer 4 as the Al content increases. The inventors have confirmed that since the $Al_xGa_{1-x}N$-based semiconductor is a mixed crystal, the structure like this can be realized using a single crystal film provided by epitaxial growth with varied material compositions.

Consider a case in which the filter layer 5 is formed of an insulating material having an electron affinity larger than that of the surface layer 4 by a predetermined value $\Delta\chi$ and the surface layer 4 is formed of AlN. In this case, as materials for forming the surface layer 4, available are aluminum oxide ($Al_2O_3$), silicon oxide ($SiO_x$), silicon nitride ($SiN_x$), aluminum nitride (AlN), a mixed crystal semiconductor of gallium nitride—aluminum nitride ($Al_xGa_{1-x}N$) ($0.65 \leqq x \leqq 1$), and oxides of these materials.

Now, in the equilibrium state as shown in FIG. 6(*a*), a number of electrons are present in the conduction band of the electron supplying layer 2. However, since the conduction band edge of the surface layer 4 has a high energy level, the electrons will never reach the outermost surface. On the other hand, application of a forward bias to such a structure (a positive voltage to the surface electrode side) will cause the energy band to bend as shown in FIG. 6(*b*). As a result, the gradients of the concentration and the potential cause electrons present in the electron supplying layer 2 to be transported toward the surface layer 4 through the electron transport layer 3. In other words, an electron current flows. In addition, the $Al_xGa_{1-x}N$ forming the electron transport layer 3 and the AlN forming the surface layer 4 are non-doped. Accordingly, the electrons injected from the electron supplying layer 2 to the electron transport layer 3 and the surface layer 4 can travel without being captured by recombination with holes or the like. Furthermore, the electron transport layer 3 is continuously graded in composition and thereby no energy barrier, which prevents electrons from traveling, is formed on the conduction band edge. Thus, this is advantageous in that electrons are efficiently transported to the surface.

However, suppose that defects such as cracks are present in the electron transport layer 3. This causes electrons to flow via surface levels or defect levels, thereby generating leakage currents that flow into the surface electrode 6 without passing through the NEA state portion in the surface layer 4 (see the dashed lines of FIG. 6(*b*)). The electrons that do not pass through the NEA state portions in the surface layer 4 cannot be launched into a vacuum. This electron device has the filter layer 5 formed of an insulating material disposed between the surface layer 4 and the surface electrode 6. The filter layer 5 functions as a barrier against the leakage current to prevent the leakage current from flowing into the surface electrode 6. Furthermore, the filter layer 5 has an electron affinity larger than that of the surface layer 4 by a predetermined value $\Delta\chi$, that is, the filter layer 5 has a conduction band edge energy level lower than that of the surface layer 4. Accordingly, the filter layer 5 does not act as a barrier against the movement of electrons having an energy level equal to or greater than that of the conduction band edge of the surface layer 4. That is, the presence of the filter layer 5 serves to prevent only the leakage current, and thus electrons are effectively emitted from the surface layer 4 in response to the voltage applied between the surface electrode 6 and the electron supplying layer 2 (or the ohmic electrode 1), thereby increasing the efficiency of electron emission.

Figure 2A:
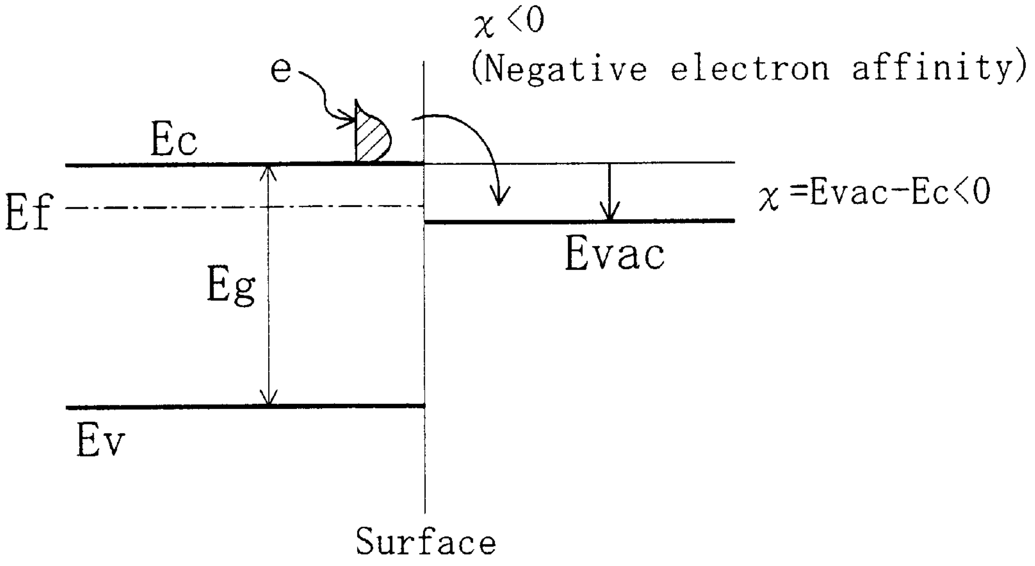
Fig. 2(a) PRIOR ART
FIGS. 2(*a*) and 2(*b*) are energy band diagrams illustrating the energy state of semiconductor materials having negative and positive electron affinity, respectively.
Figure 2B:
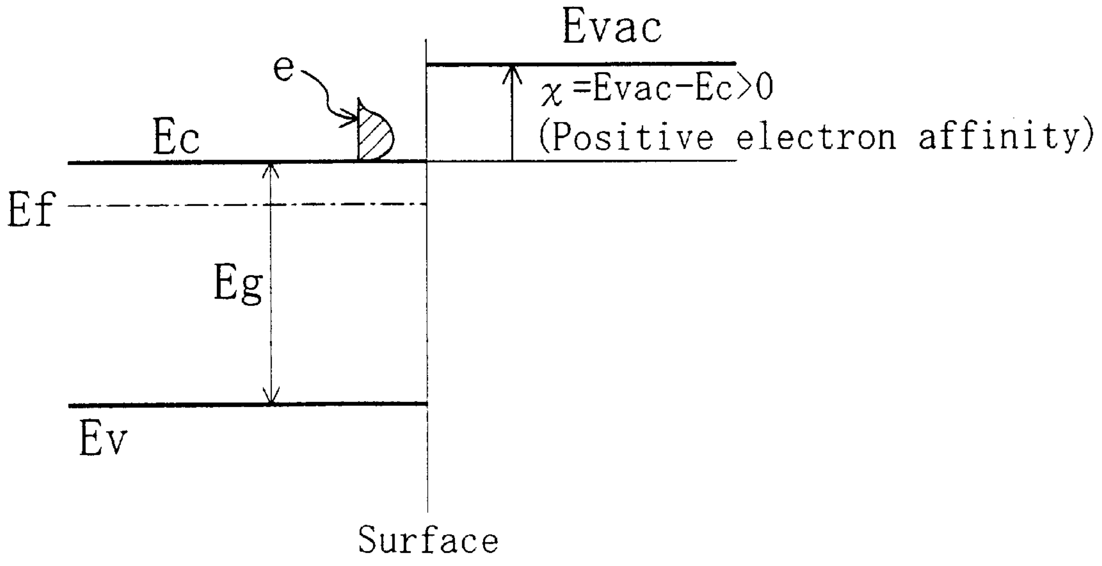
Fig. 2(b) PRIOR ART
Figure 3A:
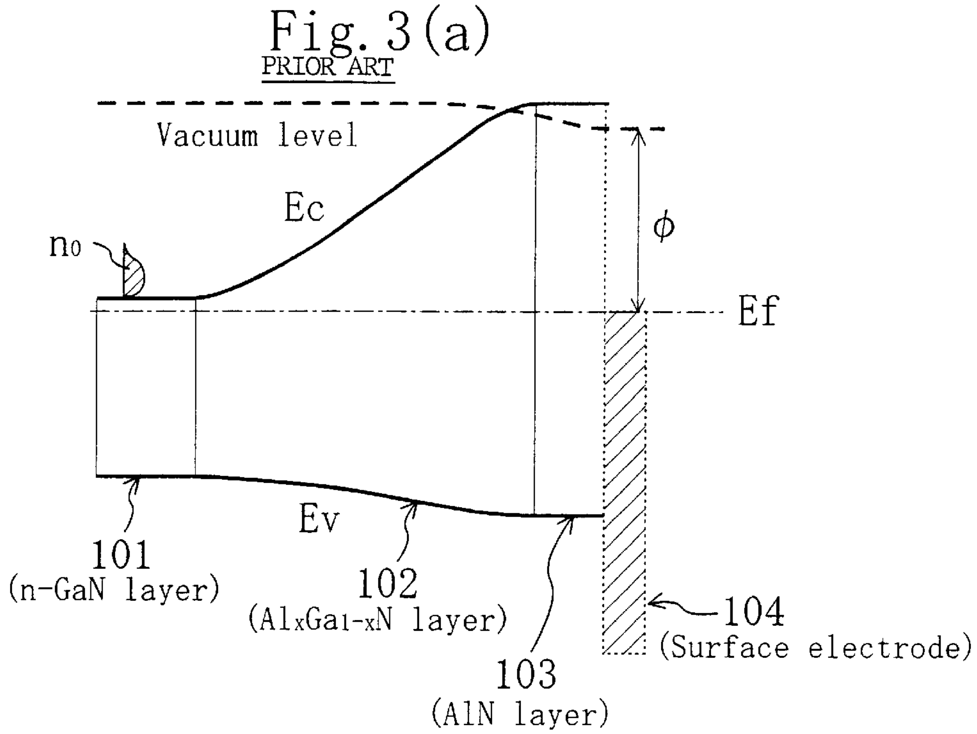
Fig. 3(a) PRIOR ART
FIGS. 3(*a*) and 3(*b*) are energy band diagrams of a prior-art electron device, illustrating a non-biased state (an equilibrium state) and a forward-biased state (the forward bias is V), respectively.
Figure 3B:
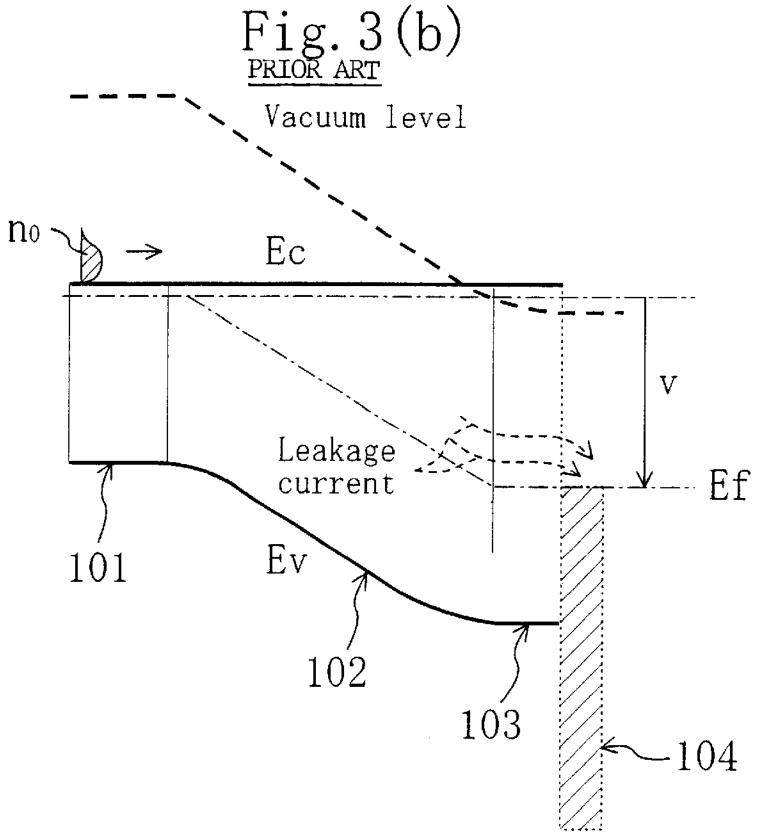
Fig. 3(b) PRIOR ART

Incidentally, as shown in FIGS. 2(*a*) and (*b*), electrons present in a conduction band have in general an energy distribution. Thus, when the surface layer 4 has a positive but sufficiently small electron affinity $\chi$, it is possible to emit a certain amount of electrons with a low energy but at a reduced efficiency. In this context, the NEA materials of the present invention include not only a material having a negative electron affinity (the intrinsic NEA material as shown in FIG. 6(*a*)) but also a material having a positive electron affinity small enough to assume that the value of $\chi$ is substantially zero (a quasi NEA material).

Incidentally, as the conventional NEA materials, for example, known are the structures in which the surface of a semiconductor such as gallium arsenic (GaAs) or gallium phosphor (GaP) is slightly coated with a low work-function material such as cesium (Cs), cesium oxide (Cs—O), cesium antimony (Cs—Sb), or rubidium oxide (Rb—O). With these materials, since the surface layer is lacking in stability, it is possible in general to maintain the NEA state only in a high vacuum.

In addition, NEA materials employing no surface adsorptive layer include diamond or a wide bandgap material, which can be used as the material for forming the filter layer 5 of the present invention.

With the aforementioned structural example, such a case has been described in which the composition of the electron transport layer 3 varies continuously and whereby the electron affinity is reduced continuously (or the bandgap increases continuously). However, the structure of the electron transport layer 3 of the present invention is not limited thereto. There would be no problem so long as a step-wise or a somewhat discontinuous variation in composition does not exert a serious effect on the movement of electrons. That is, the effect of the present invention can be obtained if the composition of the material forming the electron transport layer 3 varies so as to reduce the electron affinity of the entire electron transport layer 3 toward the surface.

Now, described below is the structure which is provided, like the aforementioned structural example, with a reduced Al content ratio x at the end portion adjacent the surface layer 4 of the electron transport layer 3, with the $Al_xGa_{1-x}N$ being employed as the material forming the surface layer 4 and the electron transport layer 3.

Figure 8A:
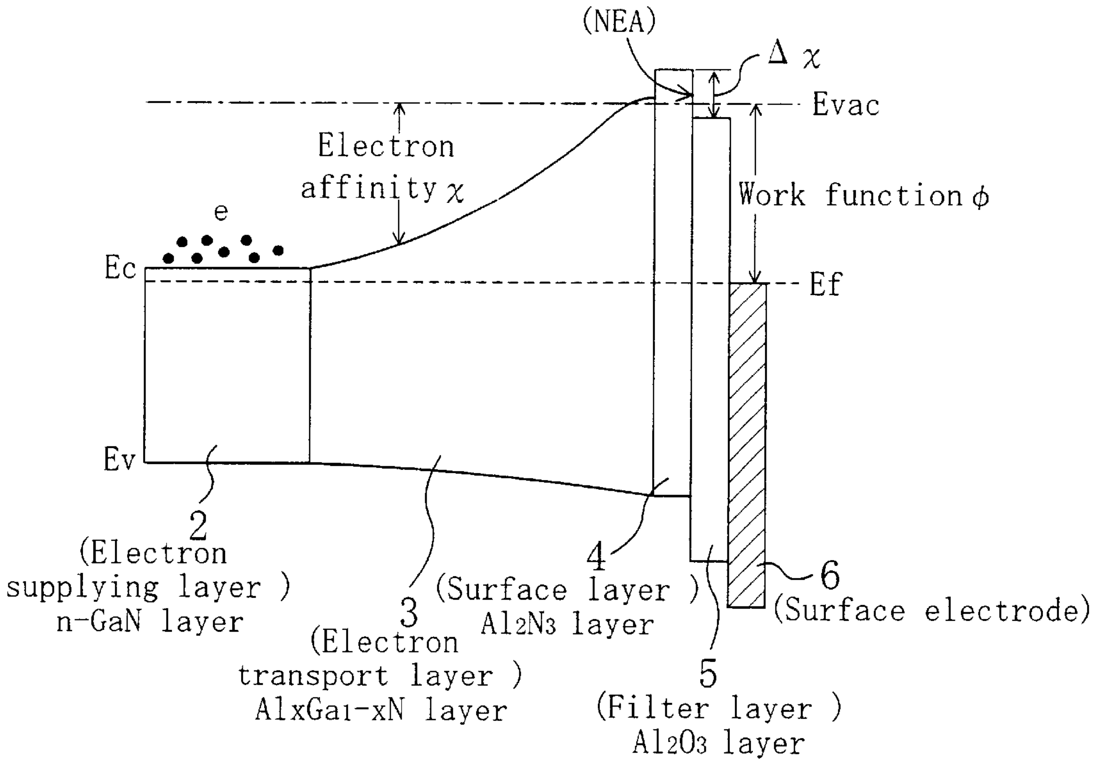
FIGS. 8(*a*) and 8(*b*) are energy band diagrams of a NEA electron device employing $Al_xGa_{1-x}N$ ($0 \leqq x \leqq y$ and $y<1$) as an electron transport layer, illustrating an equilibrium state and a forward-biased energy state.
Figure 8B:
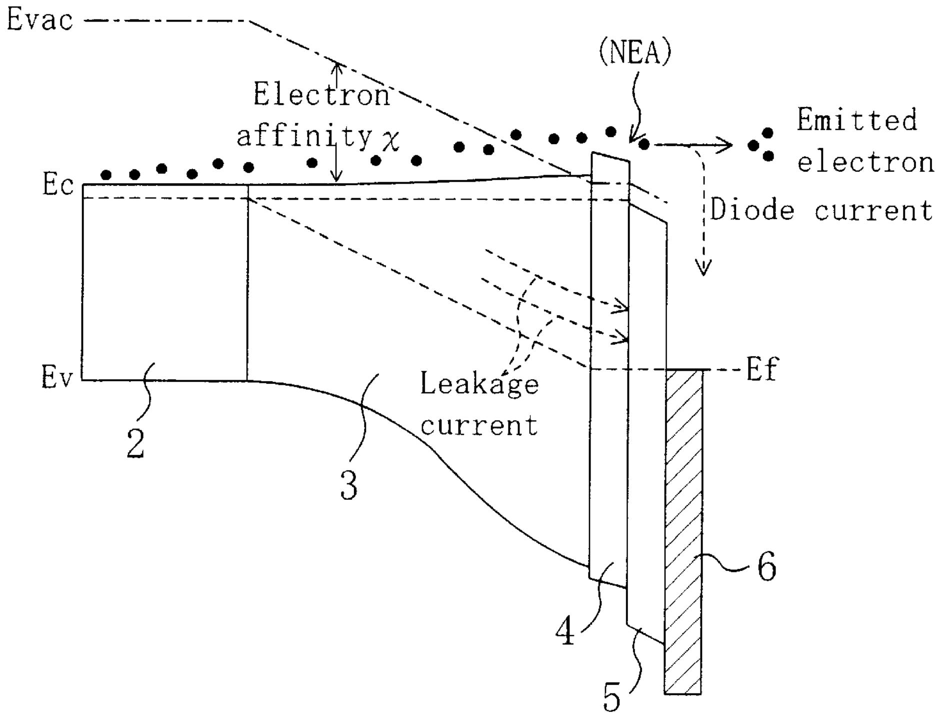

FIGS. 8(*a*) and (*b*) are energy band diagrams of a NEA electron device employing $Al_xGa_{1-x}N$ ($0 \leqq x \leqq y$ and $y<1$) as the electron transport layer, illustrating an equilibrium state and a forward-biased energy state. In this structure, the geometric structure of the electron device is the same as that shown in FIG. 4, however, the composition of the material forming the electron transport layer 3 is different from that shown in FIG. 4.

As shown in FIG. 8(*a*), in this structural example, a non-doped $Al_xGa_{1-x}N$ layer ($0 \leqq x \leqq y$ and $y<1$) functioning as the electron transport layer 3 is formed on the electron supplying layer 2 (n-GaN). Then, on top thereof, an AlN layer is deposited which functions as the surface layer 4. In addition, on the surface layer 4, the filter layer 5 of aluminum oxide and the surface electrode 6 of platinum (Pt) are successively formed. As shown in FIG. 8(*a*), in such a structure, a discontinuity in energy level is produced at the interface between the electron transport layer 3 and the surface layer 4. The value of energy barrier in the conduction band depends on the Al content ratio y (the maximum value of x) of the $Al_xGa_{1-x}N$ layer that is applicable to the electron transport layer. When this value is excessively large, it is impossible to efficiently move electrons, which are injected from the electron supplying layer 2, to the electron transport layer 3. For this reason, in this structural example, the Al content ratio y is set within the range of $0.5 \leqq y \leqq 0.8$.

In addition, consider the case where the filter layer 5 is formed of an insulating material having an electron affinity larger than that of the surface layer 4 by the predetermined value $\Delta\chi$, like the first embodiment, and the surface layer 4 is formed of AlN. In this case, for example, available as the material forming the filter layer 5 are aluminum oxide ($Al_2O_3$), silicon oxide ($SiO_x$), and silicon nitride ($SiN_x$).

Then, as shown in FIG. 8(*b*), application of a forward bias between the electron supplying layer and the surface electrode (a positive voltage to the surface electrode side) will cause the energy band of the electron transport layer 3 and the surface layer 4 to bend in response to the value of voltage applied. As a result, like the electron device shown in FIG. 4, the gradients of the concentration and the potential cause electrons present in the electron supplying layer 2 to be transported toward the surface layer 4 through the electron transport layer 3. In other words, an electron current flows. Here, suppose that the AlN layer forming the surface layer 4 is thin in thickness to some extent and the energy barrier in the conduction band edge between the electron transport layer and the surface layer is low to a certain extent. In this case, it is possible for the electrons having reached the interface between the electron transport layer and the surface layer to move beyond the barrier provided by the surface layer 4 to the outermost surface. That is, electrons can be launched into a vacuum from the surface layer 4, which is formed of a material having an electron affinity being negative or close to zero. The thickness of the surface layer in such a structure cannot be restricted due to the relationship with the thickness or the Al content ratio of the electron transport layer 3 but is in general 10 nm or less.

As described above, the compositionally graded $Al_xGa_{1-x}N$ layer having a discontinuous energy barrier in the conduction band is used as the electron transport layer 3. Even in this case, it is made possible to move electrons efficiently from the n-GaN layer having a positive electron affinity to the surface layer 4 having a negative electron affinity. With this structure, like the one shown in FIG. 4, the filter layer 5 is also interposed between the surface layer 4 and the surface electrode 6, where the filter layer 5 is formed of an insulating material having an electron affinity larger than that of the surface layer 4 by the predetermined value $\Delta\chi$. This prevents only the leakage current and allows electrons to be effectively emitted from the surface layer 4 in response to the voltage applied between the surface electrode 6 and the electron supplying layer 2 (or the ohmic electrode 1), thereby providing an increased efficiency of electron emission.

Now, various specific examples of electron devices are described below which are obtained by incorporating the basic structure according to the first embodiment of the present invention.

First Specific Example

Figure 9:
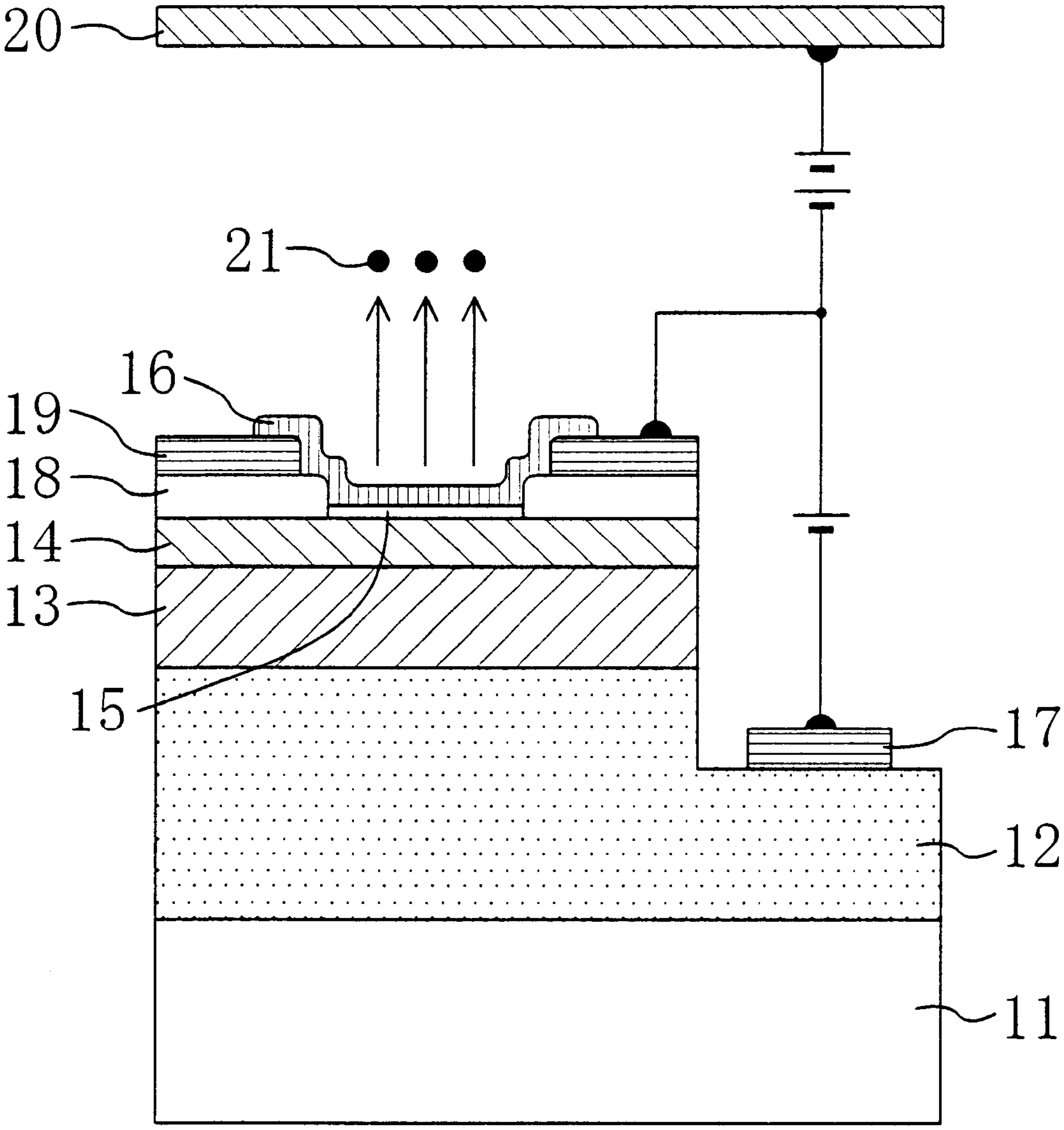
FIG. 9 is a sectional view illustrating the structure of a NEA electron device according to a first specific example of the first embodient of the present invention.

FIG. 9 is a sectional view illustrating the structure of a NEA electron device according to a first specific example of the present invention. As shown in the figure, the NEA electron device according to this specific example includes a sapphire substrate 11, an n-GaN layer 12 provided on the sapphire substrate 11 to function as an electron supplying layer, and an $Al_xGa_{1-x}N$ layer 13, provided on the n-GaN layer 12, for functioning as an electron transport layer having an Al content ratio x changing from 0 to 1 continuously in general. The NEA electron device also includes an AlN layer 14 provided on the $Al_xGa_{1-x}N$ layer 13 to function as a surface layer, an alumina layer 15 ($Al_2O_3$) provided on the AlN layer 14 to function as a filter layer, and an electrode layer 16. In addition, the NEA electron device includes an ohmic electrode 17 formed on the n-GaN layer 12, and a lead electrode 19 for electrically connecting to the electrode layer 16 via an insulating layer 18. Here, the $Al_xGa_{1-x}N$ layer 13 has an Al content ratio x substantially equal to zero at the junction with the n-GaN layer 12, while having a graded composition with the Al content ratio equal to substantially one at the junction with the AlN layer 14. For example, the electrode layer 16 of this specific example may be formed of nickel (Ni), titanium (Ti), platinum (Pt), or other metals, being about 5 to 10 nm in thickness. In addition, the lead electrode 19 of this specific example is a signal connection terminal portion for applying a voltage between the ohmic electrode 17 and the electrode layer 16, being about 200 nm in thickness. As the material thereof, the same type of metal as the metal film that forms the electrode layer 16 may be employed. However, the material may be selected in consideration of the bonding strength with the alumina layer 15 and the insulating layer 18 formed of an oxide film or a nitride film.

In addition, an anode electrode 20 is spaced opposite to the surface of the electron device and an appropriate positive bias voltage is applied thereto, thereby accelerating and collecting electrons 21 that are launched out of the electron device.

The element structure of this specific example is substantially the same as the basic structural example of the NEA electron device shown in FIG. 4. Thus, as described above, the structure is forward biased to allow the electrons supplied from the n-GaN layer 12 (the electron supplying layer) to travel controllably through the $Al_xGa_{1-x}N$ layer 13 (the electron transport layer), the AlN layer 14 (the surface layer), and the alumina layer 15 (the filter layer). This makes it possible to efficiently launch the electrons out of the surface of the electrode layer 16. At this time, some electrons flow into the electrode layer 16 as a matter of course. However, successful setting of the material, the thickness, and the area of the electrode layer 16 would makes it possible to launch electrons out of the electrode layer 16.

Furthermore, the alumina layer 15 is provided which functions as the filter layer. This prevents electrons from flowing as leakage current to the electrode layer 16 via defects such as cracks present in the $Al_xGa_{1-x}N$ layer 13 and the AlN layer 14, thereby making it possible to provide an improved efficiency of electron emission.

In the NEA electron device having the structure of the first specific example described above, the inventors have confirmed that an application of a forward bias of about 2 to 10V between the ohmic electrode and the electrode layer results in the emission of the electrons 21 in response to the voltage applied, causing a current of emitted electrons of about $10^2$ to $10^3$ (A/cm$^2$) to flow through the anode electrode 20. Incidentally, the anode electrode 20 is disposed about 1 mm above the electrode layer 16, and an anode voltage of 250V is applied to the anode electrode 20.

On the other hand, the alumina layer 15, which functions as the filter layer in this specific example, exists only between the AlN layer and the electrode layer but is not limited to this structure.

Figure 10:
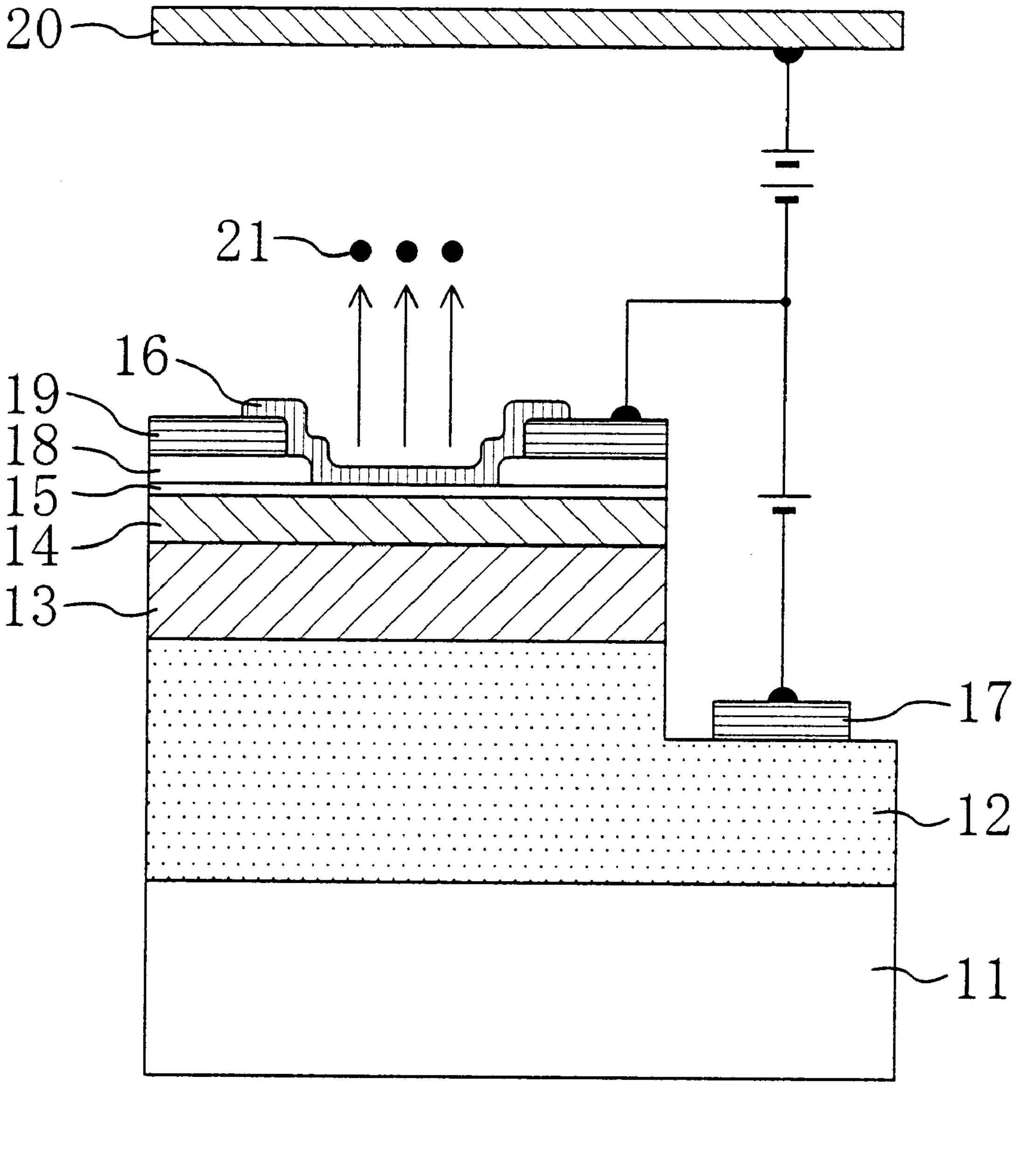
FIG. 10 is a sectional view illustrating the structure of an electron device according to a modified example of the first specific example.

FIG. 10 is a sectional view illustrating the structure of an electron device according to a modified example of the first specific example, with the alumina layer 15 being formed on the entire surface of the AlN layer 14. The structure according to this modified example also provides the same effect as in the first specific example.

Furthermore, in this specific example, the filter layer is formed of alumina (aluminum oxide $Al_2O_3$). However, the material forming the filter layer according to the present invention is not limited thereto. As described above, the filter layer may be formed of aluminum nitride (AlN), silicon nitride ($SiN_x$), aluminum nitride (AlN), a mixed crystal semiconductor of gallium nitride—aluminum nitride ($Al_xGa_{1-x}N$) ($0.65 \leqq x \leqq 1$), and oxides of these materials.

In the aforementioned specific example and the modified example thereof, the emitted electrons 21 are only captured on the anode electrode 20. With the surface of the anode electrode 20 being coated with phosphor or the like, irradiation of the phosphor with the electrons provides light emission, thereby making it possible to constitute a display device or the like which employs the light emission.

Incidentally, in this specific example and the modified example thereof, the anode electrode 20 is spaced apart from the NEA electron device. However, the present invention is not limited to this arrangement. It is also possible to integrate the anode electrode 20 with the NEA electron device using an insulating structure.

Now, described below is a method for fabricating the NEA electron device according to this specific example.

First, tri-methyl gallium (TMG) and ammonia ($NH_3$) are allowed to react with each other to form a GaN buffer layer (not shown) by MOCVD on the sapphire substrate 11. Thereafter, silane ($S_iH_4$) is added to a similar reactive gas to form the n-GaN layer 12 acting as an electron supplying layer. Then, it is stopped to supply the $S_iH_4$ gas or a dopant gas. Thereafter, tri-methyl aluminum (TMA) is introduced to start forming the $Al_xGa_{1-x}N$ layer 13 and then the TMG is gradually decreasingly supplied on the way while the dose of Al is being gradually increased. The $Al_xGa_{1-x}N$ layer 13 is thereby formed which has an Al content ratio being made continuously higher in general upwardly. Then, finally, the Al content ratio x is made equal to one, that is, the content ratio of Ga is made equal to zero. The AlN layer 14 acting as a surface layer is thereby formed on the $Al_xGa_{1-x}N$ layer 13. At this time, to grow a high-quality $Al_xGa_{1-x}N$ layer 13, the reaction temperature may be gradually varied in some cases. By these techniques, it is possible to form continuously with good quality the n-GaN layer 12 acting as the electron supplying layer, the $Al_xGa_{1-x}N$ layer 13 acting as the electron transport layer, and the AlN layer 14 acting as the surface layer. In this specific example, the n-GaN layer 12 was made 4 $\mu$m in thickness, the $Al_xGa_{1-x}N$ layer 0.07 $\mu$m in thickness, and the AlN layer 0.01 $\mu$m in thickness.

Incidentally, the method for forming the n-GaN layer 12, the $Al_xGa_{1-x}N$ layer 13, and the AlN layer 14 is not limited to the aforementioned method. For example, it is possible to employ the MBE method or the like instead of the MOCVD method. In addition, another method is also available to form the $Al_xGa_{1-x}N$ layer having a graded composition. For example, it is possible to epitaxially grow a thin Al layer on the GaN layer to be then heat treated, thereby forming an $Al_xGa_{1-x}N$ layer having lower Al content ratios toward the bottom and higher Al content ratios toward the surface.

Then, the ohmic electrode 17 is formed on the n-GaN layer 12 acting as the electron supplying layer. At this time, since the sapphire used as the substrate is an insulator, it is impossible to provide an electrode on the reverse side of the sapphire substrate 11. For this reason, the n-GaN layer 12 was etched to a certain depth from the surface to expose part of the n-GaN layer 12. Then, the ohmic electrode 17 (formed of a material of Ti/Al/Pt/Au) is formed on the region of the n-GaN layer 12, which has been exposed by the etching, by the electron beam evaporation method.

Then, the insulating layer 18 is formed on the AlN layer 14. After the AlN layer 14 has been patterned to make an opening in part of the AlN layer 14, the alumina layer 15 and the lead electrode 19 are formed on the AlN layer 14 which is exposed at the opening. The material thereof can be selected as appropriate. As the material forming the insulating layer 18, $SiO_2$ or the like is employed preferably. As the material forming the lead electrode 19, preferably employed is Ti, Al or the like. For this specific example, the $SiO_2$ film was made 100 nm in thickness and the Al electrode 200 nm in thickness.

Furthermore, the electrode layer 16 is formed on the AlN layer 14 acting as the surface layer. The electrode layer 16 can employ its material as appropriate, preferably Pt, Ni, Ti or the like. On the other hand, the method for forming the electrode layer 16 can employ the electron beam evaporation method in general, but is not limited thereto. Incidentally, the electrode layer 16, acting as an electron emitting portion, is preferably made as thin as possible to provide an improved efficiency of electron emission. In this specific example, the electrode layer 16 was made 5 nm in thickness and 20 $\mu$m in diameter.

Second Specific Example

The aforementioned first specific example and the modified example thereof are newly provided with the filter layer 15 on the surface layer 14 in addition to the insulating layer 18. However, part of the insulating layer 18 may be allowed to function as the filter layer.

Figure 11:
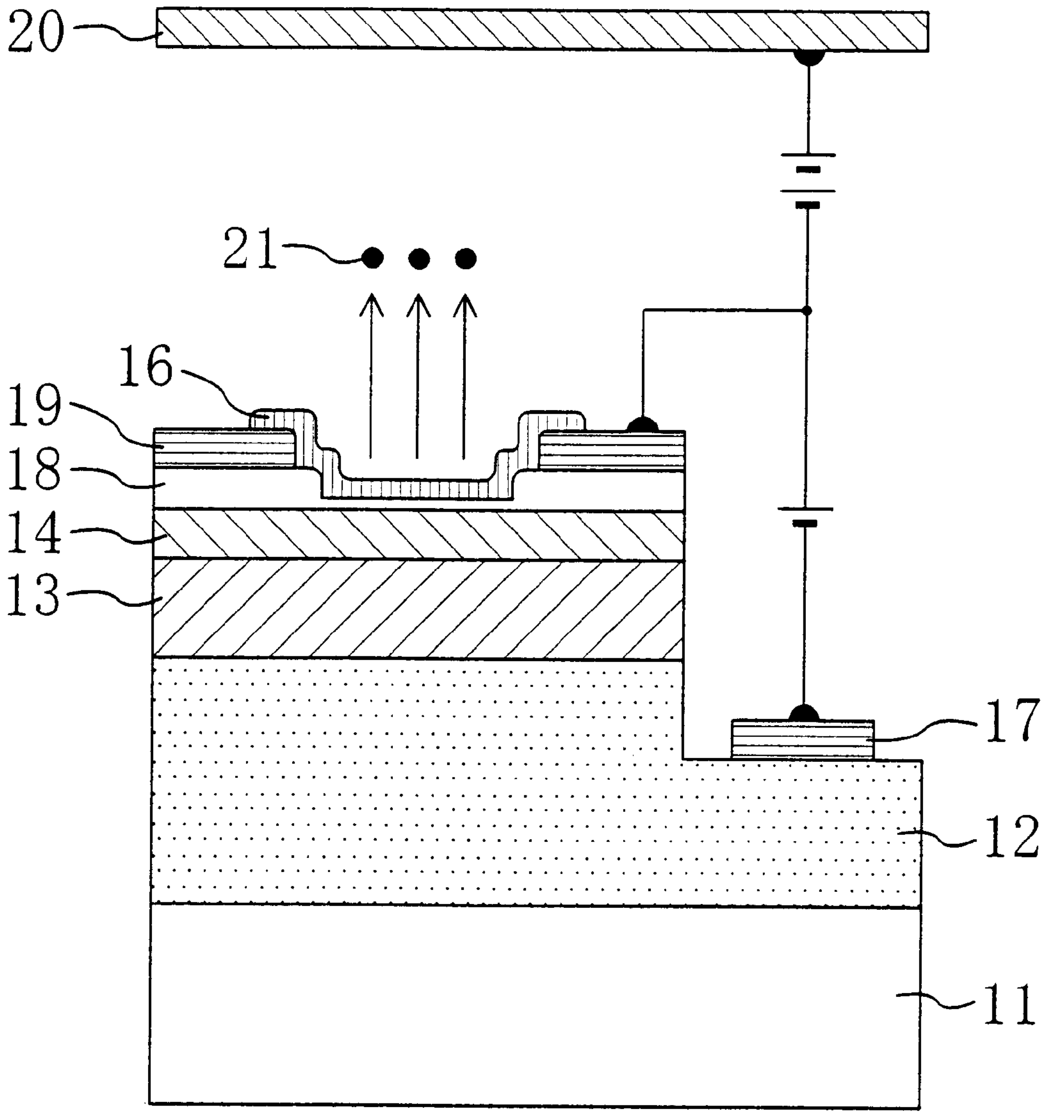
FIG. 11 is a sectional view illustrating the structure of a NEA electron device according to a second specific example of the present invention.

FIG. 11 is a sectional view illustrating the structure of a NEA electron device according to a second specific example of the present invention. As shown in the figure, this specific example allows the region, which is made thin by etching part of the silicon oxide film used as an intermediate layer, to function as the filter layer. In this structural example, the original insulating layer is 10 nm in thickness, while the etched portion that functions as the filter layer is 10 nm in thickness. In this structure, like the aforementioned first specific example, the inventors have confirmed that an application of a bias voltage between the ohmic electrode and the electrode layer results in the emission of the electrons 21 in response to the voltage applied, causing a current of emitted electrons to flow through the anode electrode 20.

Third Specific Example

The aforementioned specific example employs the AlN layer 14 as the surface layer. An $Al_xGa_{1-x}N$ material having compositions within the range of $0.65 \leqq x \leqq 1$ may be employed as the surface layer since the $Al_xGa_{1-x}N$ material having a Al content ratio x of 0.65 or more functions as the NEA material.

Figure 12:
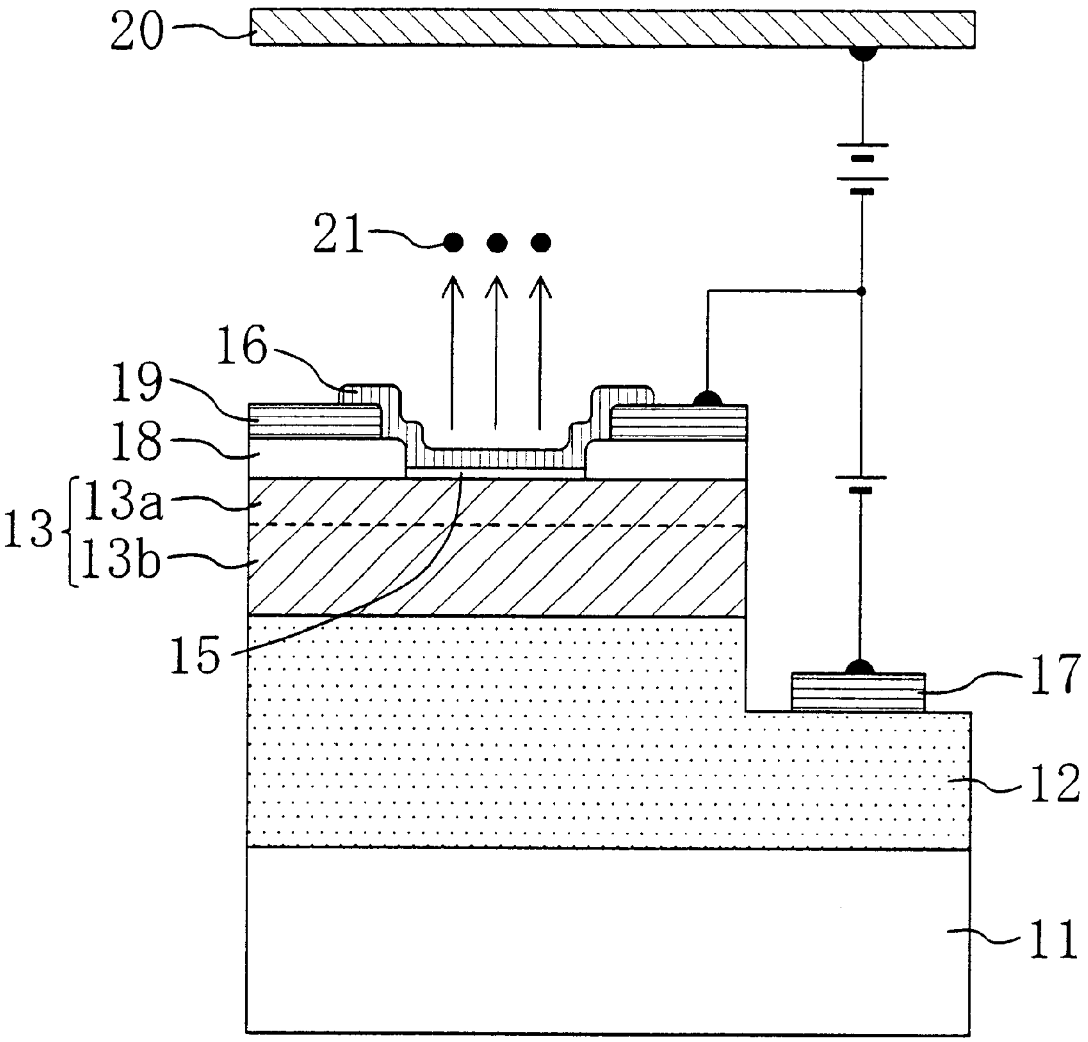
FIG. 12 is a sectional view illustrating the structure of a NEA electron device according to a third specific example of the present invention.

FIG. 12 is a sectional view illustrating the structure of a NEA electron device according to a third specific example of the present invention. As shown in the figure, this specific example is provided with the n-GaN layer 12 acting as an electron supplying layer on the sapphire substrate 11, with the $Al_xGa_{1-x}N$ layer 13 being provided on the n-GaN layer 12. It is to be noted that this specific example is provided with no AlN layer. This is because the first specific example employs the AlN layer or a NEA material as the surface layer, however, an $Al_xGa_{1-x}N$ material having compositions within the range of $0.65 \leqq x \leqq 1$ can be employed as the surface layer since the $Al_xGa_{1-x}N$ material having a Al content ratio x of 0.65 or more functions as the NEA material like the AlN. That is, the Al content ratio x being made equal to or greater than 0.65 on an upper portion 13*a* of the $Al_xGa_{1-x}N$ layer 13 allows the upper portion 13*a* of the $Al_xGa_{1-x}N$ layer 13 to function as the surface layer and a lower portion 13*b* of the $Al_xGa_{1-x}N$ layer 13 to function as the electron transport layer.

For example, this specific example can employ a structure that is obtained by varying the Al content ratio x of the $Al_xGa_{1-x}N$ layer 13 continuously from the electron supplying layer and then stopping the epitaxial growth when a composition of $Al_{0.9}Ga_{0.1}N$ is reached. Alternatively, such a structure may also be employed that is obtained by epitaxially growing a layer having the same composition of $Al_{0.9}Ga_{0.1}N$ of about several nanometers in thickness after the composition of $Al_{0.9}Ga_{0.1}N$ has been reached.

Furthermore, as described above, suppose that the electron affinity of the surface layer has not reached a negative one. Even in this case, such a composition is still acceptable in which the portion equivalent to the electrons distributed in the conduction band has an electron affinity with a higher energy level than the vacuum level. In other words, a structure formed of a material that can substantially realize the NEA state is still acceptable even when the structure is not formed of an intrinsic material.

On top of the upper portion 13*a* of the $Al_xGa_{1-x}N$ layer functioning as the surface layer, the filter layer 15 and the electrode layer 16 are also provided. The filter layer 15 and the electrode layer 16 can employ the same material and structure as those employed in the aforementioned specific examples.

Like each of the aforementioned specific examples, the NEA electron device according to this arrangement is forward biased (a positive voltage to the electrode layer 16) to allow the electrons supplied from the n-GaN layer 12 (the electron supplying layer) to travel controllably through the lower portion 13*b* of the $Al_xGa_{1-x}N$ layer 13 (the electron transport layer). This makes it possible to efficiently launch the electrons outwardly from the upper portion 13*a* of the $Al_xGa_{1-x}N$ layer 13 (the surface layer).

Fourth Specific Example

The aforementioned third specific example employs, as the surface layer, the upper portion of the $Al_xGa_{1-x}N$ layer ($0.65 \leqq x \leqq 1$) in the NEA state. However, it is also acceptable to deposit a NEA material (not shown) like the AlN layer directly on the upper portion 13*a* of the $Al_xGa_{1-x}N$ layer shown in FIG. 12. This structure can be considered to have an energy barrier present in the conduction band of the electron device shown in FIG. 8. Alternatively, the structure can be considered to have a filter layer of AlN provided to the electron device shown in FIG. 6. In any case, like each of the aforementioned specific examples, it is possible to launch electrons efficiently.

Fifth Specific Example

Figure 13:
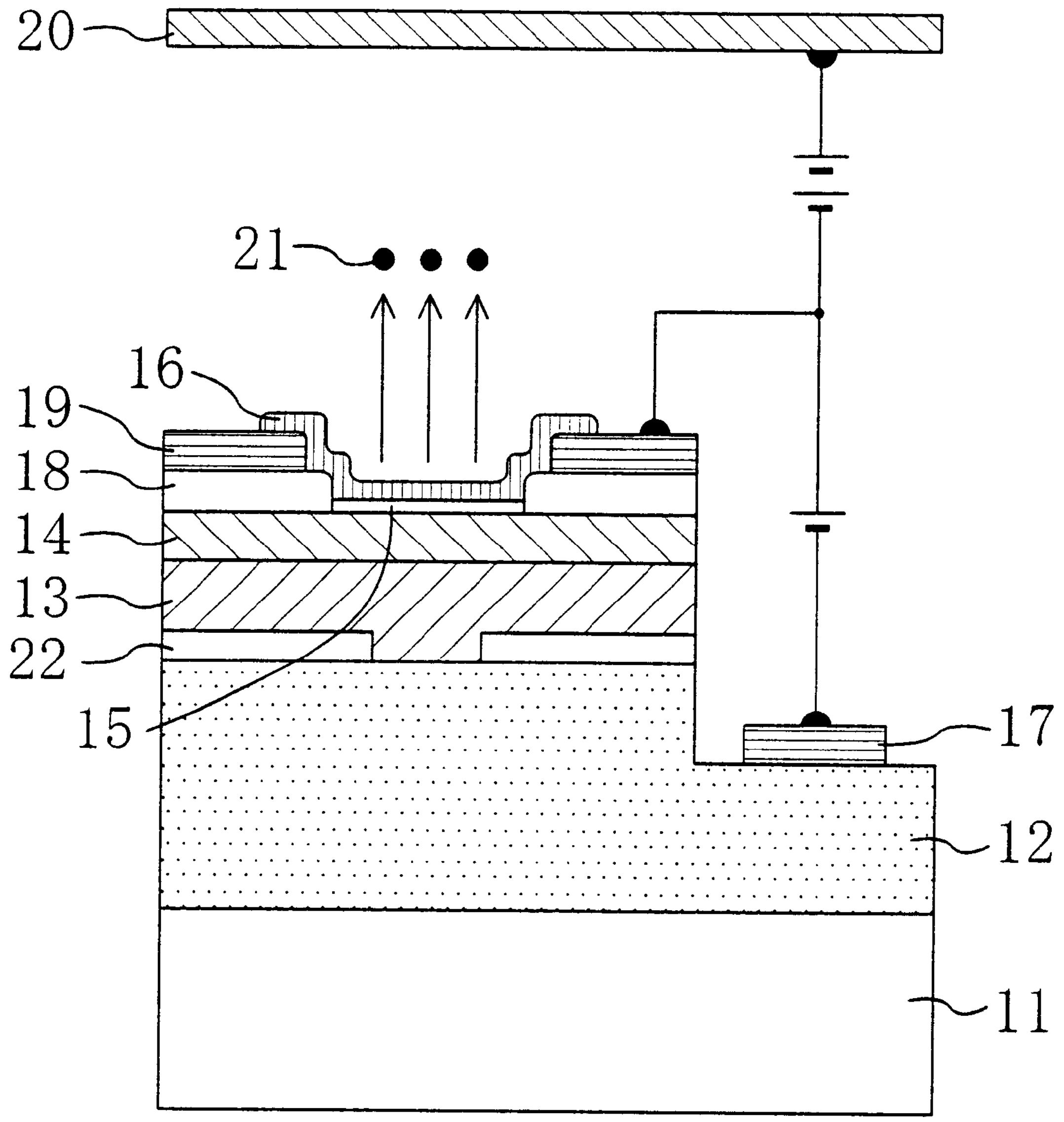
FIG. 13 is a sectional view illustrating the structure of a NEA electron device according to a fifth specific example of the present invention.

FIG. 13 is a sectional view illustrating the structure of a NEA electron device according to a fifth specific example of the present invention. In addition to the structure of the electron device according to the aforementioned first specific example, this specific example includes a buried insulating layer 22 (or a buried p-type layer) disposed near the interface between the n-GaN layer 12 and the $Al_xGa_{1-x}N$ layer 13. This specific example confines an electron current traveling through the $Al_xGa_{1-x}N$ layer 13, acting as an electron transport layer, by means of the buried insulating layer 22 disposed near the n-GaN layer 12/$Al_xGa_{1-x}N$ layer 13 interface, thereby increasing the density of electrons reaching the electrode layer 16 acting as the surface electrode. For example, a buried insulating layer 22 having an opening 5 μm in diameter was inserted. In this case, a current density of about $2\times10^3$ (A/cm$^2$) was obtained due to the concentration effect of the electron current.

Incidentally, in this specific example, the electrode layer 16 functions as an electron emissive portion and is thus preferably as thin as possible to provide an increased efficiency of electron emission.

In addition, in consideration of the ease of the process, it is preferable that the buried insulating layer 22 (or the buried p-type layer) is provided at the position shown in FIG. 13 as in this specific example. However, in some cases, it is also acceptable to provide a member having the same function in the $Al_xGa_{1-x}N$ layer 13 or the n-GaN layer 12.

Furthermore, the electron devices according to the modified example of the aforementioned first specific example and second to fourth specific examples may be provided with an insulating layer or a buried p-type layer, which is the same as the buried insulating layer 22 (or a buried p-type layer) according to this specific example, thereby making it possible to provide the same effect as that of this specific example.

Sixth Specific Example

With reference to this specific example, such an example of electron device is described that is fabricated using the aforementioned NEA electron device and can perform the transistor operation.

Figure 14:
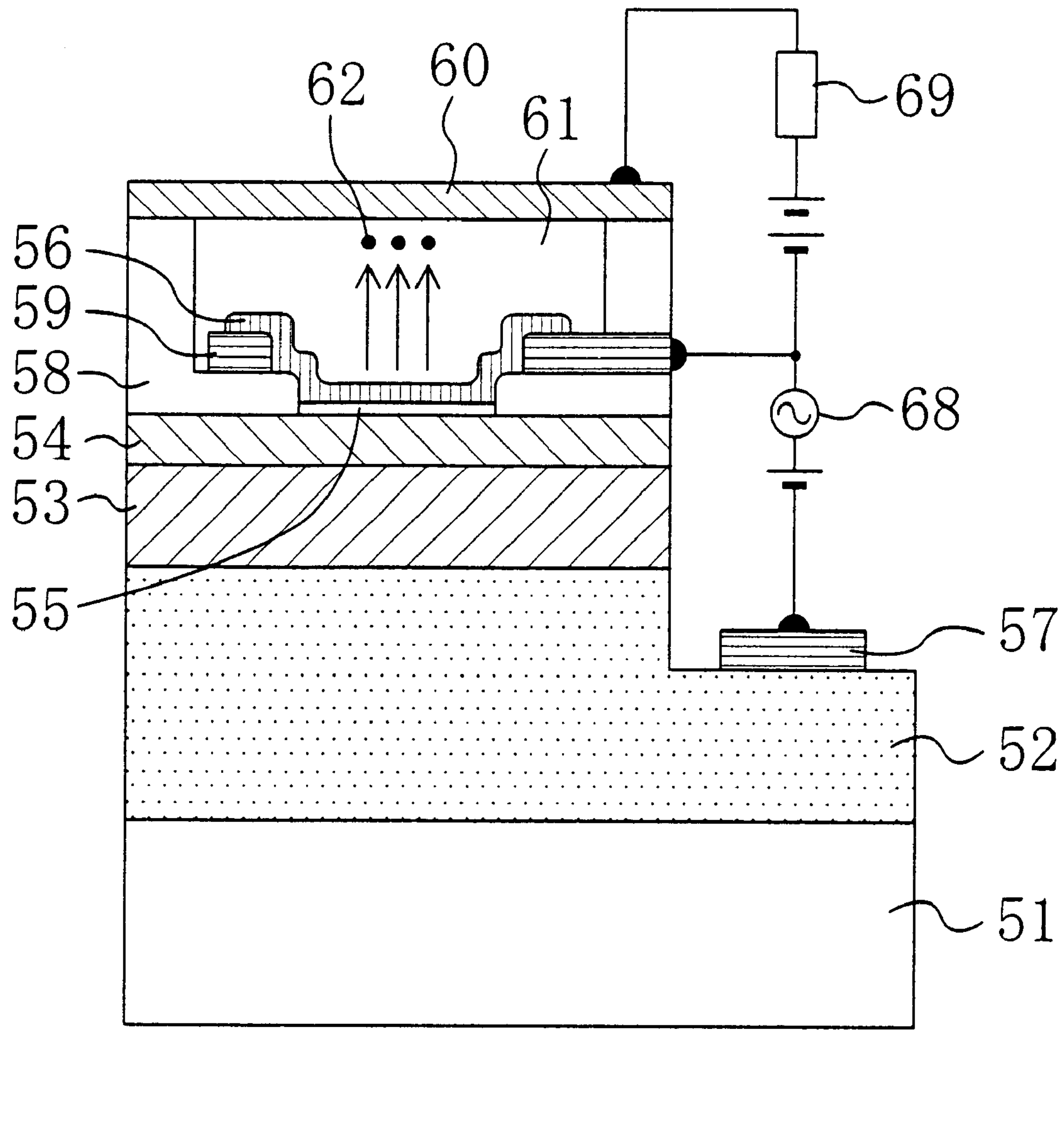
FIG. 14 is a sectional view illustrating the structure of a NEA electron device according to a sixth specific example of the present invention.

FIG. 14 is a sectional view illustrating the structure of a NEA electron device according to a sixth specific example of the present invention. The electron device (a vacuum transistor) according to this specific example makes use of a structure similar to the first specific example (the NEA electron device shown in FIG. 9). As shown in FIG. 14, the electron device according to this specific example includes a sapphire substrate 51 and an n-GaN layer 52, provided on the sapphire substrate 51, for functioning as an electron supplying layer. The electron device also includes an $Al_xGa_{1-x}N$ layer 53 which is provided on the n-GaN layer 52, has a composition varying continuously in general, and functions as an electron transport layer, and an AlN layer 54, provided on the $Al_xGa_{1-x}N$ layer 53, for functioning as a surface layer. The electron device further includes an $Al_2O_3$ layer 55, provided on the AlN layer 54, for functioning as a filter layer, an electrode layer 56 provided on the $Al_2O_3$ layer 55, an ohmic electrode 57 provided on the n-GaN layer 52, an insulating layer 58 having an opening portion above the electrode layer 56, a lead electrode 59 connected electrically to the electrode layer 56, and a collecting electrode 60.

The structure described above is obtained as follows. That is, the insulating layer 58 of the NEA electron device described in the aforementioned first specific example is extended upwardly and connected to the collecting electrode 60, thereby sealing an electron transport room 61 in which electrons 62 travel. Here, the electron transport room 61 surrounded by the electrode layer 56, the insulating layer 58, and the collecting electrode 60 has an inner diameter of about 50 $\mu$m and is reduced in pressure to be about $10^{-5}$ Torr (about 1.33 mPa).

The electron device (a vacuum transistor) according to this specific example is adapted to accelerate the electrons 62, emitted in response to a signal applied between the electrode layer 56 and the ohmic electrode 57, in the electron transport room 61 reduced in pressure to receive the electrons by the collecting electrode 60. Since the electron transport region is a vacuum, the electron device functions as an amplifying element or a switching element which is high in insulation, low in internal loss, and less in temperature dependency.

Incidentally, the electron device according to this specific example makes use of the structure of the NEA electron device similar to the first specific example but not limited thereto. It is also possible to provide the same effect by using the NEA electron device described in any one of the modified example of the aforementioned first specific example and the second to fifth specific examples.

Seventh Specific Example

Now, described below is an electron device according to a seventh specific example which can be said to be a modified example of the aforementioned sixth specific example.

Figure 15:
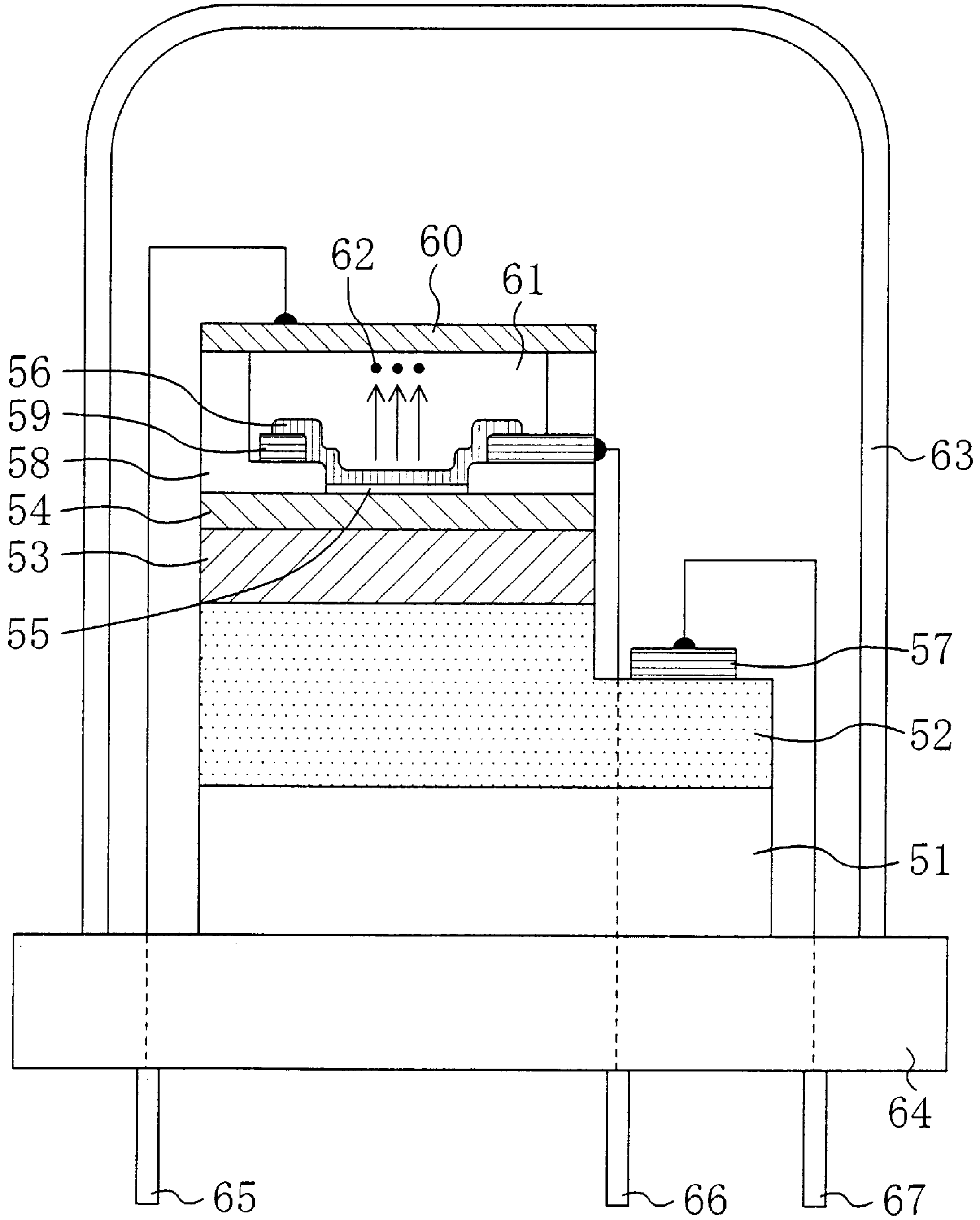
FIG. 15 is a sectional view illustrating the structure of a NEA electron device according to a seventh specific example of the present invention.

FIG. 15 is a sectional view illustrating the structure of the electron device according to this specific example. This specific example has a structure for accommodating a NEA electron device in a sealed container.

As shown in FIG. 15, the electron device according to this specific example has the same structure as that shown in FIG. 14 according to the aforementioned sixth specific example. In addition, the electron device includes a sealing cap 63, a jig 64 for attaching the sealing cap 63 and the NEA electron device, and terminals 65–67 to be electrically connected to the ohmic electrode 57, the electrode layer 56, and the collecting electrode 60. However, in this specific example, the electron transport room 61 is not sealed by the insulating layer 58, the collecting electrode 60 or the like, but the insulating layer 58 is formed in the shape of a bridge. In this specific example, the sealing member includes the sealing cap 63 and the jig 64, with the electron transport room 61 therein being maintained at a high vacuum of about $10^{-5}$ Torr (about 1.33 mPa) or less.

This specific example can also provide the same effect as that of the aforementioned specific example. In particular, this specific example provides an advantage of facilitating reduction of the degree of vacuum (the degree of pressure reduction) in the electron transport room 61 down to $10^{-5}$ Torr (about 1.33 mPa) or less.

Eighth Specific Example

With reference to this specific example, an example of an electron device is also described which is fabricated using the aforementioned NEA electron device and can perform the transistor operation.

Figure 16:
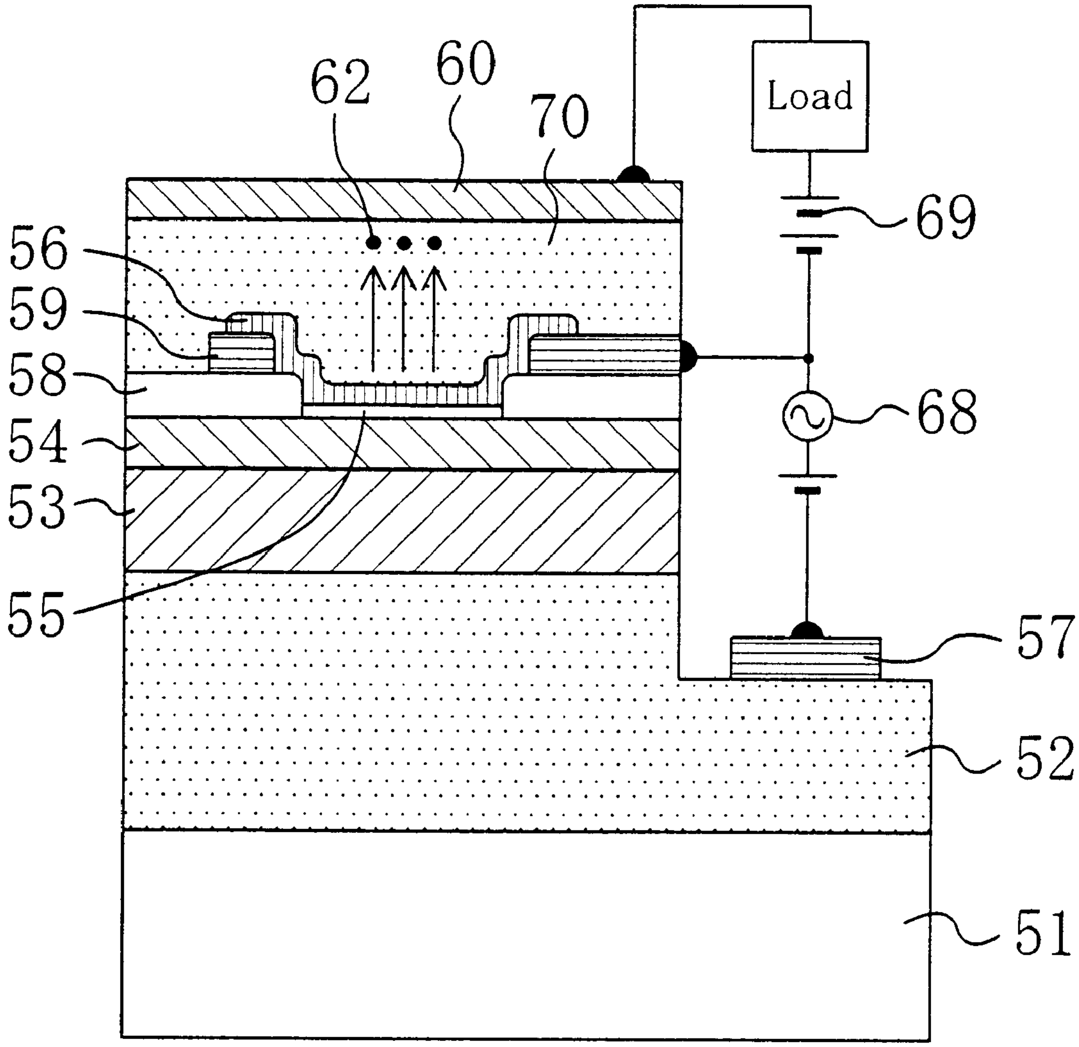
FIG. 16 is a sectional view illustrating the structure of a NEA electron device according to an eighth specific example of the present invention.

FIG. 16 is a sectional view illustrating the structure of a NEA electron device according to an eighth specific example. The electron device according to this specific example makes use of a structure similar to the first specific example (the NEA electron device shown in FIG. 9). As shown in FIG. 16, the electron device according to this specific example includes the sapphire substrate 51 and the n-GaN layer 52, provided on the sapphire substrate 51, for functioning as an electron supplying layer. The electron device also includes the $Al_xGa_{1-x}N$ layer 53 which is provided on the n-GaN layer 52, has a composition varying continuously in general, and functions as an electron transport layer, and the AlN layer 54, provided on the $Al_xGa_{1-x}N$ layer 53, for functioning as a surface layer. The electron device further includes the $Al_2O_3$ layer 55, provided on the AlN layer 54, for functioning as a filter layer, the electrode layer 56 provided on the $Al_2O_3$ layer 55, and the lead electrode 59 to be connected electrically to the electrode layer 56. The electron device still further includes the ohmic electrode 57 provided on the n-GaN layer 52, an insulating layer 70 formed of a silicon oxide film (a $SiO_2$ film) for covering the electrode layer 56 and the lead electrode 59, and the collecting electrode 60 provided on the insulating layer 70. In addition, provided are an AC power supply 68 for applying an AC voltage between the ohmic electrode 57 and the lead electrode 59, and a DC power supply 69 for applying a DC bias between the lead electrode 59 and the collecting electrode 60.

The structure described above can be considered to be a structure in which the electron transport room 61 according to the aforementioned seventh specific example is filled with the insulating layer 70.

The electron device according to this specific example is adapted to accelerate the electrons 62, which are injected to the insulating layer 70, in response to a signal applied between the electrode layer 56 and the ohmic electrode 57, and the electrons are received by the collecting electrode 60. The electron device functions as an amplifying element or a switching element which is high in insulation, low in internal loss, and less in temperature dependency.

Figure 17A:
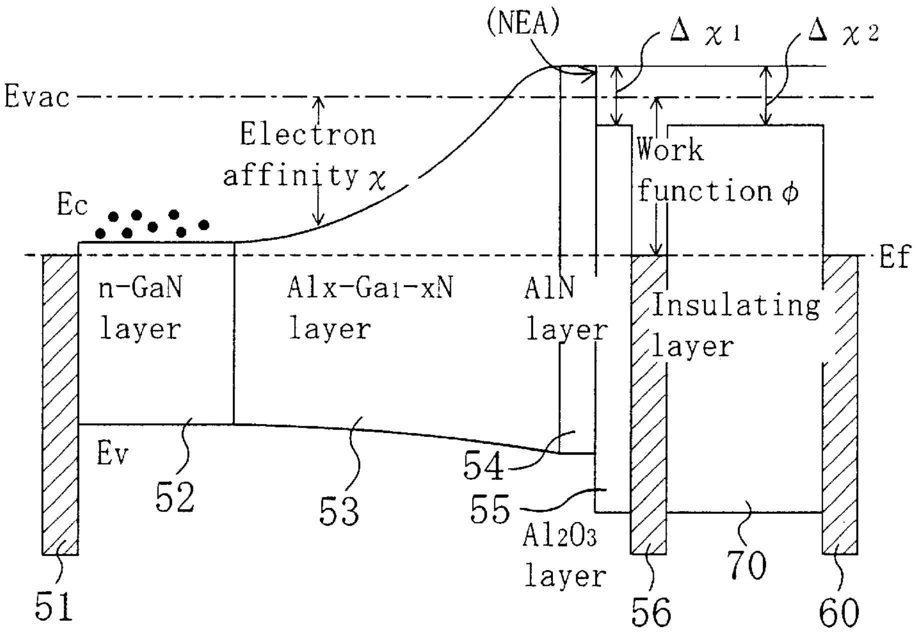
FIGS. 17(*a*) and 17(*b*) are energy band diagrams of the electron device according to the eighth specific example, illustrating a non-biased state (an equilibrium state) and a forward-biased state (the forward bias is V), respectively.
Figure 17B:
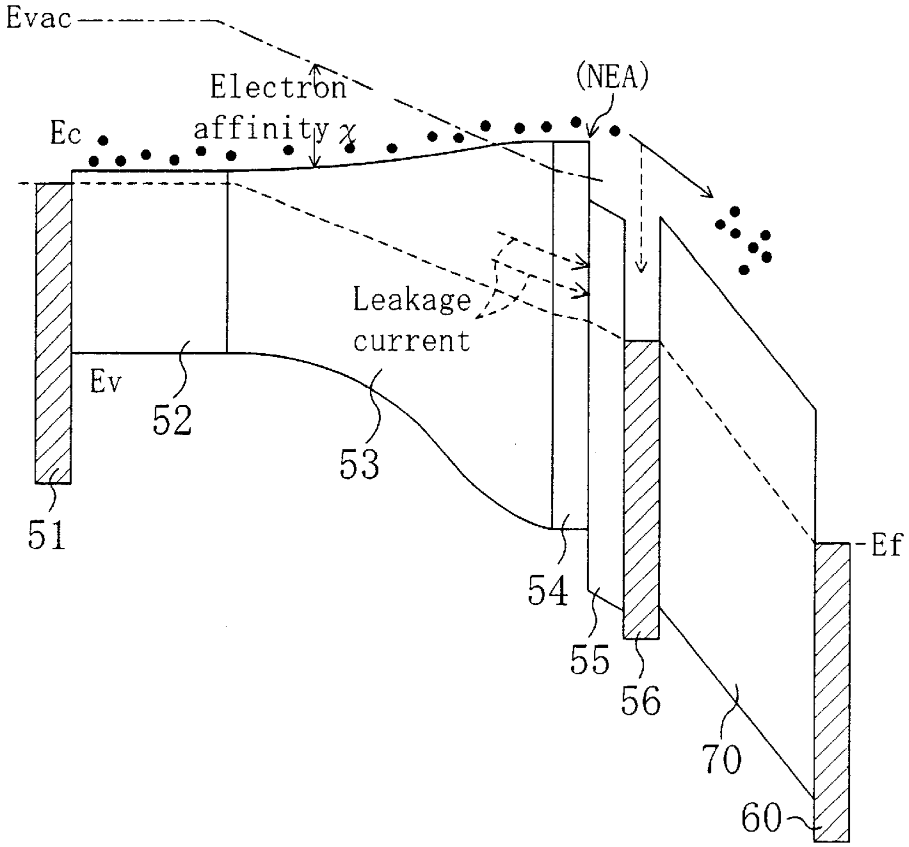

FIGS. 17(*a*) and (*b*) are energy band diagrams of the electron device according to this specific example. The figures illustrate each of the electron device, that is, the n-GaN layer 52, the $Al_xGa_{1-x}N$ layer 53, the AlN layer 54, the $Al_2O_3$ layer 55, the electrode layer 56, the insulating layer 70, and the collecting electrode 60 in a non-biased state (an equilibrium state) and a forward-biased state (the forward bias is V), respectively. As shown in FIG. 17(*a*), the band structure of the NEA electron device according to this specific example is the same as that shown in FIG. 6. In addition, in this specific example, the electron affinity of the $Al_2O_3$ layer 55 is larger than that of the AlN layer 54 by a predetermined value $\Delta\chi_1$, while the electron affinity of the insulating layer 70 is larger than that of the AlN layer 54 by a predetermined value $\Delta\chi_2$.

Furthermore, application of a forward bias to such a structure (a positive voltage to the surface electrode side) will cause the energy band to bend as shown in FIG. 17(*b*). The same action as the one described with reference to FIG. 6(*b*) serves to prevent only leakage current and allows electrons to be emitted effectively from the AlN layer 54 in response to the positive voltage applied between the electrode layer 56 and the n-GaN layer 52 (or the ohmic electrode 57). In addition, the band of the insulating layer 70 is bent in response to the voltage applied between the collecting electrode 60 and the electrode layer 56, thereby causing the electrons to travel above the conduction band edge of the insulating layer 70 to be colleted by the collecting electrode 60. Accordingly, like a vacuum transistor, the electron device functions as a switching element having a good property.

Incidentally, the electron device according to this specific example makes use of the structure of the NEA electron device similar to the first specific example but not limited thereto. It is also possible to provide the same effect by using the NEA electron device described in any one of the modified example of the aforementioned first specific example and the second to fifth specific examples.

Other Specific Examples Related to the First Embodiment

Various structural examples have been shown with reference to the structures according to the aforementioned first to eighth specific examples. It is also possible to use an arrangement that combines those structures, thereby providing the arrangement with the respective effects.

In addition, each of the aforementioned specific examples employs sapphire for the substrate and therefore an ohmic electrode is provided on the surface by etching. For an electrically conductive substrate such as SiC, the ohmic electrode can be formed on the reverse side, thereby making it possible to provide a simplified structure and process.

In addition, each of the aforementioned specific examples has the surface layer formed of AlN or $Al_xGa_{1-x}N$, however, the surface layer may be formed of other NEA materials such as diamond.

It is also acceptable to dope n-type impurities into the $Al_xGa_{1-x}N$ layer of the aforementioned first to eighth specific examples, thereby allowing the layer to act as an n-type semiconductor.

In the aforementioned first to eighth specific examples, it is also acceptable to provide a plurality of electron emitting portions (surface layers) in one element.

The specific examples employing the aforementioned $Al_xGa_{1-x}N$ layer is provided with a structure in which the Al content ratio x of the $Al_xGa_{1-x}N$ layer varies continuously, however, such a structure is also acceptable in which the Al content ratio x of the $Al_xGa_{1-x}N$ layer varies, for example, in steps.

Embodiment 2

Now, described below is a second embodiment of the junction transistor.

Figure 18:
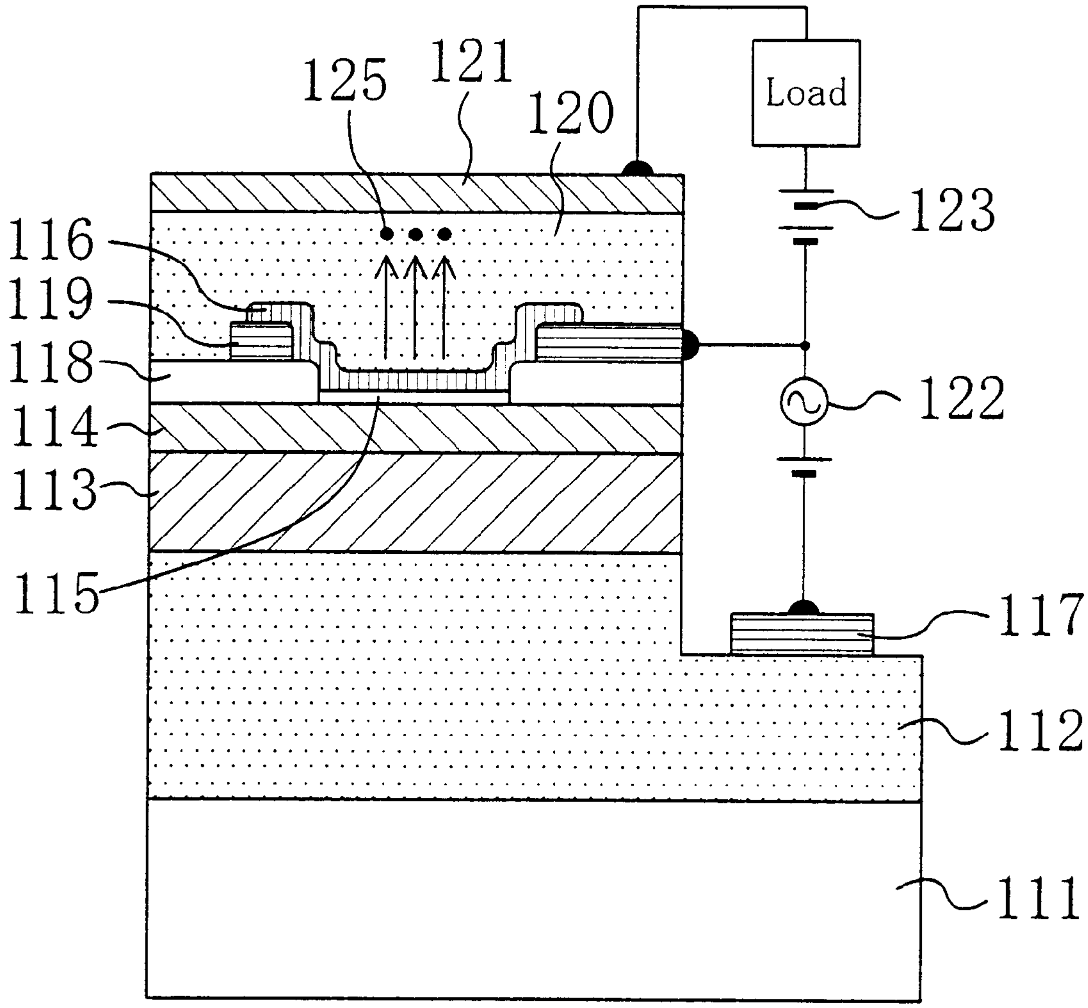
FIG. 18 is a sectional view illustrating the structure of a junction transistor employing a NEA material according to the second embodiment of the present invention.

FIG. 18 is a sectional view illustrating the structure of a junction transistor according to this embodiment. As shown in FIG. 18, the junction transistor according to this embodiment includes a sapphire substrate 111 and an n-GaN layer 112, provided on the sapphire substrate 111, for functioning as the emitter layer. The junction transistor also includes an $Al_xGa_{1-x}N$ layer 113 which is provided on the n-GaN layer 112, has a composition varying continuously in general, and functions as an electron transfer layer, and an AlN layer 114, provided on the $Al_xGa_{1-x}N$ layer 113, for functioning as a surface layer. The junction transistor further includes an $Al_2O_3$ layer 115, provided on the AlN layer 114, a control electrode 116 provided on the $Al_2O_3$ layer 115, and a lead electrode 119 to be connected electrically to the electrode layer 116. The junction transistor still further includes an ohmic electrode 117 provided on the n-GaN layer 112, and an insulating layer 118 formed of a silicon oxide film (a $SiO_2$ film) interposed between the AlN layer 114, and the $Al_2O_3$ layer 115 and the lead electrode 119. The junction transistor further includes an insulating layer 120 formed of a silicon oxide film (a $SiO_2$ film) for covering the control electrode 116 and the lead electrode 119, and a collecting electrode 121 provided on the insulating layer 120. In addition, provided are an AC power supply 122 for applying an AC voltage between the ohmic electrode 117 and the lead electrode 119, and a DC power supply 123 for applying a DC bias between the lead electrode 119 and the collecting electrode 121.

The junction transistor according to this embodiment is adapted to accelerate electrons 125, which are injected to the insulating layer 120, in response to a signal applied between the control electrode 116 and the ohmic electrode 117, and the electrons are received by the collecting electrode 121. The junction transistor functions as a high-output power transistor which is high in insulation, low in internal loss, and less in temperature dependency.

Figure 19A:
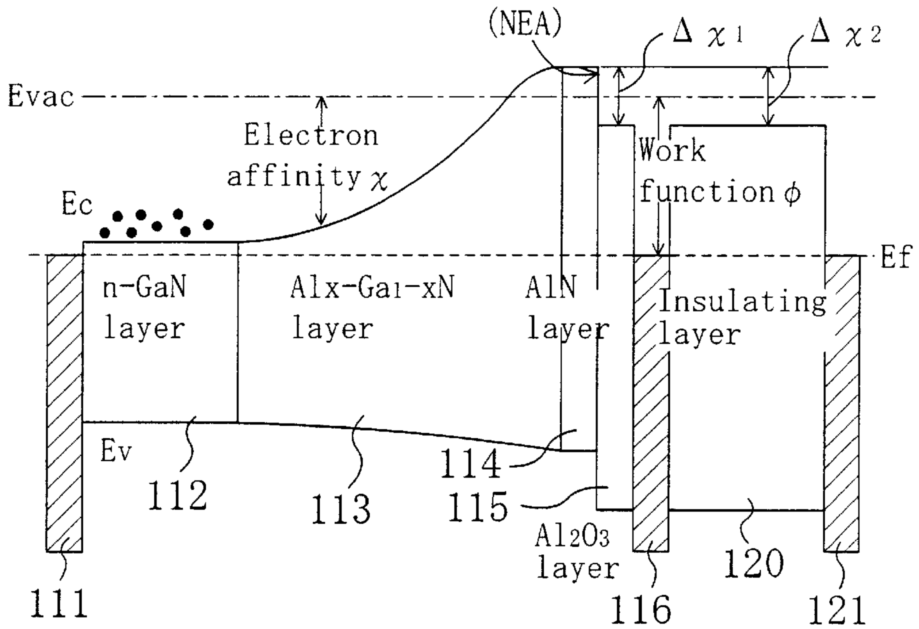
FIGS. 19(*a*) and 19(*b*) are energy band diagrams of a NEA junction transistor employing $Al_xGa_{1-x}N$ ($0 \leqq x \leqq y$ and $y<1$) as an electron transfer layer, illustrating an equilibrium state and an energy state in a forward-biased state.
Figure 19B:
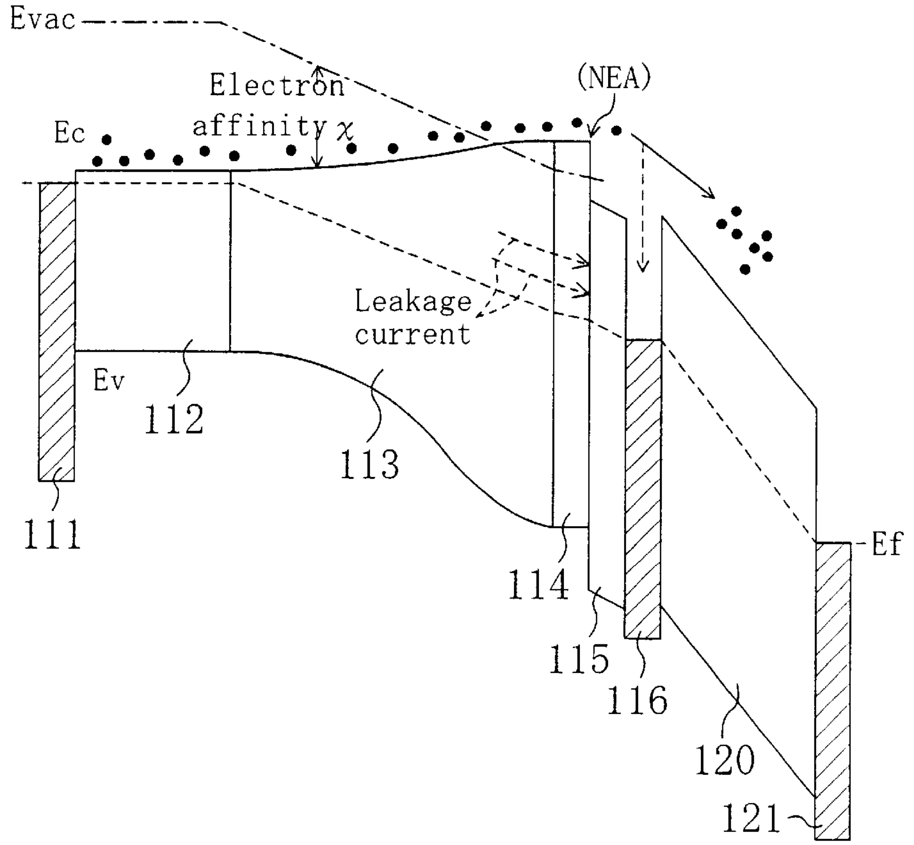

FIGS. 19(*a*) and (*b*) are energy band diagrams of the junction transistor according to this embodiment. The figures illustrate each of the junction transistor, that is, the n-GaN layer 112 (the emitter layer), the $Al_xGa_{1-x}N$ layer 113 (the electron transfer layer), the AlN layer 114 (the surface layer), the $Al_2O_3$ layer 115 (the filter layer), the control electrode 116, the insulating layer 120, and the collecting electrode 121 in a non-biased state (an equilibrium state) and a forward-biased state (the forward bias is V), respectively.

The $Al_xGa_{1-x}N$ layer 113 acting as an electron transfer layer is selected from materials that provide an electron affinity $\chi$ that is gradually reduced toward the surface. Proper selection of a material and changing the composition ratio of the material will make it possible to realize a structure in which the electron affinity is continuously reduced in general.

This structural example employs the n-doped n-GaN layer 112 as the emitter layer (with a carrier density of up to $4\times10^{18}/cm^3$), a non-doped $Al_xGa_{1-x}N$ layer 113 ($0\leqq x\leqq 1$) having a graded composition as the electron transfer layer, the AlN layer 114 as the surface layer, and the $Al_2O_3$ layer 115 as the filter layer.

The $Al_xGa_{1-x}N$ layer 113 with a graded composition contains no Al at x=0 in the portion in contact with the GaN layer 112 and no Ga at x=1 in the portion in contact with the AlN layer 114. In the portion therebetween, the value of x is gradually increased, that is, the composition is graded so that the Al content increases toward the surface. As shown in FIG. 19(*a*), such a structure as described above provides the $Al_xGa_{1-x}N$ layer 113 with a positive electron affinity in the portion in contact with the GaN layer 112. However, the electron affinity is reduced as the Al content increases toward the surface and becomes negative in the portion of the $Al_xGa_{1-x}N$ layer 113 in contact with the AlN layer 114. Accordingly, in this embodiment, the electron affinity of the electron transfer layer (the $Al_xGa_{1-x}N$ layer 113) is continuously reduced in general from the emitter layer (the GaN layer 112) to the surface layer (the AlN layer 114).

For the electron transfer layer employing a compositionally graded $Al_xGa_{1-x}N$, it can be considered that the structure described above has a continuously expanded bandgap.

In addition, in this embodiment, the electron affinity of the $Al_2O_3$ layer 115 is larger than that of the AlN layer 114 by a predetermined value $\Delta\chi_1$, while the electron affinity of the insulating layer 120 is larger than that of the AlN layer 114 by a predetermined value $\Delta\chi_2$.

Now, in the equilibrium state as shown in FIG. 19(*a*), a number of electrons are present in the conduction band of the GaN layer 112 (the emitter layer). However, since the conduction band edge of the AlN layer 114 has a high energy level, the electrons will never reach the outermost surface. On the other hand, application of a forward bias to such a structure (a positive voltage to the control electrode side) will cause the energy band to bend as shown in FIG. 19(*b*). As a result, the gradients of the concentration and the potential cause electrons present in the GaN layer 112 (the emitter layer) to be transported toward the AlN layer 114 (the surface layer) through the $Al_xGa_{1-x}N$ layer 113 (the electron transfer layer). In other words, an electron current flows. In addition, the $Al_xGa_{1-x}N$ layer 113 and the AlN layer 114 are non-doped. Accordingly, the electrons injected from the GaN layer 112 (the emitter layer) via the $Al_xGa_{1-x}N$ layer 113 (the electron transfer layer) to the AlN layer 114 (the surface layer) can travel without being captured by recombination with holes or the like. Furthermore, the $Al_xGa_{1-x}N$ layer 113 is continuously graded in composition and thereby no energy barrier, which prevents electrons from traveling, is formed on the conduction band edge. Thus, this is advantageous in that electrons are efficiently transported to the surface.

In addition, the band of the insulating layer 120 is bent in response to the voltage applied to the collecting electrode 121 and the control electrode 116, electrons injected into the insulating layer 120 pass through the conduction band to be collected by the collecting electrode 121. The electrons will never be captured in recombination with holes or the like as in the case of traveling through the $Al_xGa_{1-x}N$ layer 113. Furthermore, the breakdown voltage of the transistor can be adjusted by the very thickness of the insulating layer 120 interposed between the control electrode 116 and the collecting electrode 121. This allows free adjustment to higher breakdown voltages in comparison with MESFETs or bipolar transistors that make use of the depletion layer of a prior-art GaAs substrate. Since a high voltage can be applied, power loss can also be made as low as possible. For example, the transistor can also function as a high-output power transistor at a base station for mobile telephones or a high-output semiconductor power transistor in wireless LANs.

As materials for forming the insulating layer 120 according to the present invention, available are aluminum oxide ($Al_2O_3$), silicon oxide ($SiO_x$), silicon nitride ($SiN_x$), aluminum nitride (AlN), a mixed crystal semiconductor of gallium nitride-aluminum nitride ($Al_xGa_{1-x}N$) ($0.65 \leqq x \leqq 1$), and oxides of these materials. In addition, the insulating layer 120 may be formed of layered films of various insulating materials.

The structure of the electron transfer layer according to the present invention is not limited to such a structure, and a positive electron affinity may be acceptable. However, as in this embodiment, a material having a negative electron affinity or a so-called NEA material may be employed, thereby allowing electrons to conduct easily through the conduction band of the insulating layer 120 to reach the collecting electrode 121.

In addition, the surface layer is not always required. However, the provision of the surface layer formed of a NEA material allows electrons to conduct easily through the conduction band of the insulating layer 120 to reach the collecting electrode 121.

Furthermore, the filter layer is not always required. However, the provision of the filter layer (the $Al_2O_3$ layer 115) serves to prevent only leakage current, allowing electrons to be injected effectively from the AlN layer 114 in response to a positive voltage being applied between the control electrode 116 and the n-GaN layer 112 (or the ohmic electrode 117).

In this case, the filter layer is formed of an insulating material having an electron affinity larger than that of the surface layer (the outermost surface portion of the electron transfer layer in the case of absence of the surface layer) by the predetermined value $\Delta\chi_1$. In the case of forming the surface layer of AlN, for example, available as the material forming the filter layer are aluminum oxide ($Al_2O_3$), silicon oxide ($SiO_x$), and silicon nitride ($SiN_x$).

Incidentally, for example, known as the conventional NEA materials are the structures in which the surface of a semiconductor such as gallium arsenic (GaAs), gallium phosphor (Gap), or silicon (Si) is slightly coated with a low work-function material such as cesium (Cs), cesium oxide (Cs—O), cesium antimony (Cs—Sb), or rubidium oxide (Rb—O). With these materials, since the surface layer is lacking in stability, it is possible in general to maintain the NEA state only in a high vacuum.

In addition, with the aforementioned structural example, such a case has been described in which the composition of the electron transfer layer varies continuously and thereby the electron affinity is reduced continuously (or the bandgap increases continuously). However, the structure of the electron transfer layer of the present invention is not limited to such a structural example. There would be no problem so long as a step-wise or a somewhat discontinuous variation in composition does not exert a serious effect on the movement of electrons.

Now, described below is a method for fabricating the NEA junction transistor according to this embodiment.

First, trimethyl gallium (TMG) and ammonia ($NH_3$) are allowed to react with each other to form a GaN buffer layer (not shown) by MOCVD on the sapphire substrate 111. Thereafter, silane ($S_iH_4$) is added to a similar reactive gas to form the n-GaN layer 112 acting as an emitter layer. Then, it is stopped to supply the $S_iH_4$ gas or a dopant gas. Thereafter, trimethyl aluminum (TMA) is introduced to start forming the $Al_xGa_{1-x}N$ layer 113 and then the TMG is gradually decreasingly supplied on the way while the dose of Al is being gradually increased. The $Al_xGa_{1-x}N$ layer 113 is thereby formed which has an Al content ratio being made continuously higher in general upwardly. Then, finally, the Al content ratio x is made equal to one, that is, the content ratio of Ga is made equal to zero. The AlN layer 114 acting as a surface layer is thereby formed on the $Al_xGa_{1-x}N$ layer 113. At this time, to grow a high-quality $Al_xGa_{1-x}N$ layer 113, the reaction temperature may be gradually changed in some cases. By these techniques, it is possible to form continuously with good quality the n-GaN layer 112 acting as the emitter layer, the $Al_xGa_{1-x}N$ layer 113 acting as the electron transfer layer, and the AlN layer 114 acting as the surface layer. In this embodiment, the n-GaN layer 112 was made 4 μm in thickness, the $Al_xGa_{1-x}N$ layer 0.07 μm in thickness, and the AlN layer 0.01 μm in thickness.

Incidentally, the method for forming the n-GaN layer 112, the $Al_xGa_{1-x}N$ layer 113, and the AlN layer 114 is not limited to the aforementioned method. For example, it is possible to employ the MBE method or the like instead of the MOCVD method. In addition, another method is also available to form the $Al_xGa_{1-x}N$ layer having a graded composition. For example, it is possible to epitaxially grow a thin Al layer on the GaN layer to be then heat treated, thereby forming an $Al_xGa_{1-x}N$ layer having lower Al content ratios toward the bottom and higher Al content ratios toward the surface.

Then, the ohmic electrode 117 is formed on the n-GaN layer 112 acting as the emitter layer. At this time, since the sapphire used as the substrate is an insulator, it is impossible to provide an electrode on the reverse side of the sapphire substrate 111. For this reason, the n-GaN layer 112 was etched to a certain depth from the surface to expose part of the n-GaN layer 112. Then, the ohmic electrode 117 (formed of a material of Ti/Al/Pt/Au) is formed on the region of the n-GaN layer 112, which has been exposed by the etching, by the electron beam evaporation method.

Then, the insulating layer 118 is formed on the AlN layer 114. After the AlN layer 114 has been patterned to make an opening in part of the AlN layer 114, the alumina layer 115 and the lead electrode 119 are formed on the AlN layer 114 which is exposed at the opening. The material thereof can be selected as appropriate. As the material forming the insulating layer 118, employed preferably is $SiO_2$ or the like. As the material forming the lead electrode 119, employed preferably is Ti, Al or the like. For this embodiment, the $SiO_2$ film was made 100 nm in thickness and the Al electrode 200 μm in thickness.

Furthermore, the control electrode 116 is formed on the AlN layer 114 acting as the surface layer. The control electrode 116 can employ its material as appropriate, preferably Pt, Ni, Ti or the like. On the other hand, the method for forming the control electrode 116 can employ the electron beam evaporation method in general, but is not limited thereto. Incidentally, the control electrode 116, acting as an electron injecting portion, is preferably made as thin as possible to provide an improved efficiency of electron injection. In this embodiment, the electrode layer 116 was made 5 nm in thickness and 20 μm in diameter.

Furthermore, after a $SiO_2$ film and a Pt film (alternatively a Ni film, a Ti film or the like) are deposited, the films are patterned to form the collecting electrode 121 and the insulating layer 120.

Modified Example

Figure 20:
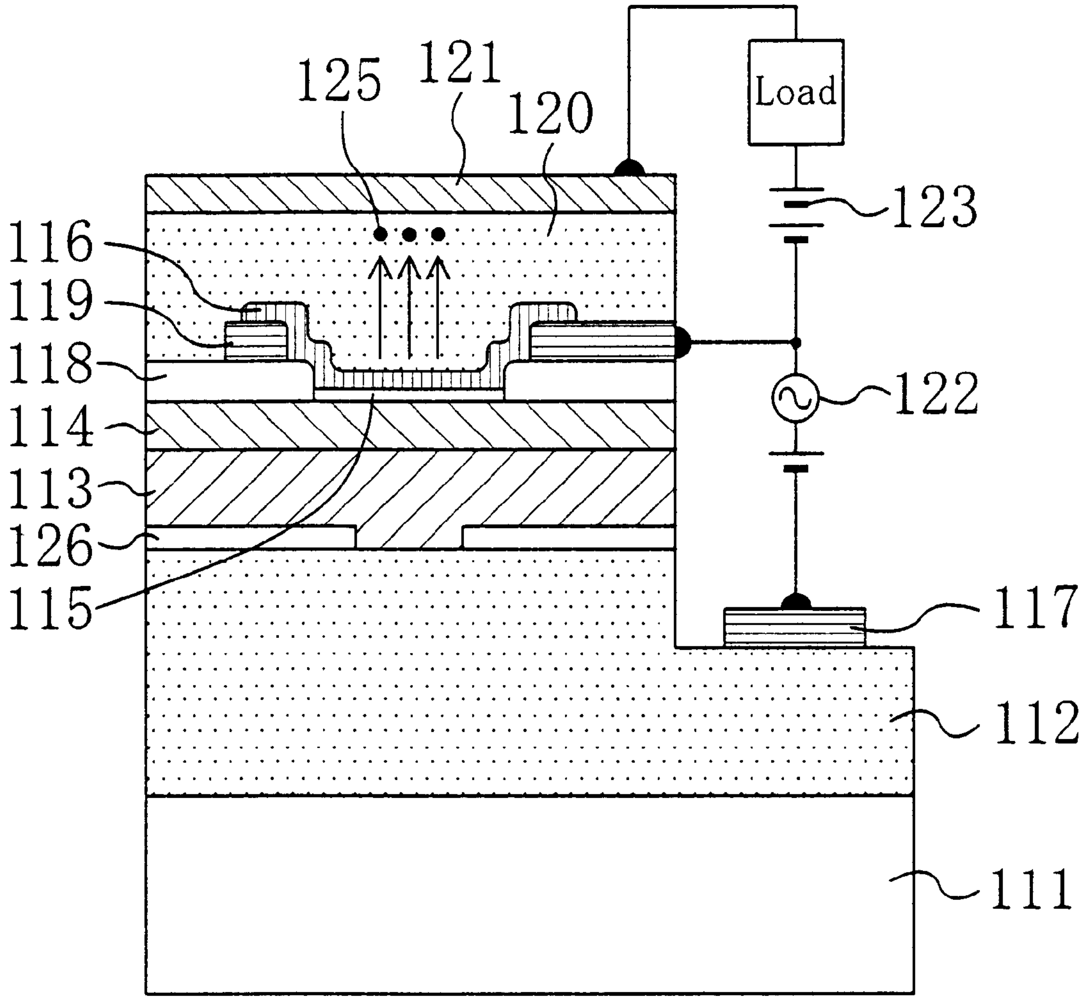
FIG. 20 is a sectional view illustrating the structure of a junction transistor according to an modified example of the second embodiment of the present invention.

FIG. 20 is a sectional view illustrating the structure of a junction transistor according to an modified example of the second embodiment of the present invention. As shown in the figure, in addition to the structure of the junction transistor according to the first embodiment, the junction transistor according to this embodiment includes a buried insulating layer 126 (or a buried p-type layer) disposed near the interface between the n-GaN layer 112 and the $Al_xGa_{1-x}N$ layer 113. This embodiment is adapted to confine an electron current traveling through the $Al_xGa_{1-x}N$ layer 113, acting as an electron transfer layer, by means of the buried insulating layer 126 disposed near the n-GaN layer 112/$Al_xGa_{1-x}N$ layer 113 interface, thereby increasing the density of electrons that reach the control electrode 116 acting as the surface electrode.

In addition, in consideration of the ease of the process, it is preferable that the buried insulating layer 126 (or the buried p-type layer) is provided at the position shown in FIG. 20 as in this embodiment. However, in some cases, it is also acceptable to provide a member having the same function in the $Al_xGa_{1-x}N$ layer 113 or the n-GaN layer 112.

Another Example According to the Second Embodiment

The aforementioned second embodiment and the modified example thereof employ sapphire for the substrate and therefore an ohmic control electrode is provided on the surface by etching. For an electrically conductive substrate such as SiC, the ohmic control electrode can be formed on the reverse side, thereby making it possible to provide a simplified structure and process.

In addition, the aforementioned second embodiment and the modified example thereof have the surface layer formed of AlN or $Al_xGa_{1-x}N$, however, the surface layer may be formed of other NEA materials such as diamond.

It is also acceptable to dope n-type impurities into the $Al_xGa_{1-x}N$ layer of the aforementioned second embodiment and the modified example thereof, thereby allowing the $Al_xGa_{1-x}N$ layer to act as an n-type semiconductor.

In the second embodiment and the modified example thereof, it is also acceptable to provide a plurality of electron injecting portions (surface layers) in one element.

The aforementioned second embodiment and the modified example thereof are adapted to have a structure in which the Al content ratio x of the $Al_xGa_{1-x}N$ layer varies continuously, however, such a structure is also acceptable in which the Al content ratio x of the $Al_xGa_{1-x}N$ layer varies, for example, in steps.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An electron device comprising an electron supplying layer, an electron transport layer provided on said electron supplying layer and modulated so that an electron affinity is reduced from the electron supplying layer to a surface layer, the surface layer provided on said electron transport layer and formed of a material having an electron affinity being negative or close to zero, a surface electrode for applying a voltage to said electron supplying layer to allow electrons to travel from said electron supplying layer to an outermost surface of said surface layer via said electron transport layer, and a filter layer, disposed between said surface layer and said surface electrode, functioning as a barrier for preventing part of electrons from traveling to said surface electrode, and having an electron affinity equal to or larger than that of said surface layer.

2. The electron device according to claim 1, wherein a region containing said electron transport layer and said surface layer is formed of $Al_xGa_{1-x}N$ ($0 \leqq x \leqq 1$) varying so as to increase the ratio of Al toward the outermost surface.

3. The electron device according to claim 1, wherein said filter layer is formed of an insulating material having a positive electron affinity.

4. The electron device according to claim 1, wherein said filter layer contains at least any one of aluminum oxide ($Al_2O_3$), silicon oxide ($SiO_x$), and silicon nitride ($SiN_x$).

5. The electron device according to claim 1, wherein said filter layer contains at least any one of aluminum nitride (AlN), a mixed crystal semiconductor of gallium nitride-aluminum nitride ($Al_xGa_{1-x}N$) ($0.65 \leqq x \leqq 1$), and oxides of these materials.

6. A junction transistor comprising:

an emitter layer for supplying electrons, an electron transfer layer provided on said emitter layer and adapted to allow supplied electrons to travel therethrough, a control electrode for applying a voltage to control the amount of electron supply from said emitter layer to said electron transfer layer, a collecting electrode for collecting at least part of electrons supplied from said emitter layer, and an insulating layer interposed between said control electrode and said collecting electrode and having an electron affinity equal to or larger than that of an end portion of said electron transfer layer adjacent said control electrode, wherein electrons injected from said electron transfer layer to said insulating layer are adapted to conduct through a conduction band of said insulating layer after being emitted from the control electrode to reach said collecting electrode, an electron transport room formed between the control electrode and the collecting electrode is filled with the insulating layer, and the electrons pass through the insulating layer to reach the collecting electrode.

7. The junction transistor according to claim 6, wherein an electron affinity of said electron transfer layer is adjusted to be reduced from said emitter layer to said control electrode.

8. The junction transistor according to claim 7, wherein said electron transfer layer has a bandgap expanding from said emitter layer to said control electrode to control the electron affinity.

9. The junction transistor according to claim 6, wherein said emitter layer and said electron transfer layer contain a layer formed of nitride.

10. The junction transistor according to claim 6, wherein said electron transfer layer is formed of $Al_xGa_{1-x}N$ ($0 \leqq x \leqq 1$) varying so as to increase the ratio of Al toward the outermost surface.

11. The junction transistor according to claim 6, wherein said insulating layer contains at least any one of aluminum oxide ($Al_2O_3$), silicon oxide ($SiO_x$), and silicon nitride ($SiN_x$).

12. The junction transistor according to claim 6, wherein said insulating layer contains at least any one of AlN, $Al_xGa_{1-x}N$ ($0.65 \leqq x \leqq 1$), and oxides of these materials.

13. The junction transistor according to claim 6, further comprising a surface layer disposed between said electron transfer layer and said control electrode, and formed of a material having an electron affinity being negative or close to zero.

14. The junction transistor according to claim 6, further comprising a filter layer, disposed between said electron transfer layer and said control electrode, functioning as a barrier for preventing electrons from traveling to said control electrode, and having an electron affinity equal to or larger than that of said control electrode.

15. The junction transistor according to claim 6, further comprising a buried layer for confining a region of electrons flowing in said electron transfer layer to part of a cross section of said electron transfer layer.

16. The junction transistor according to claim 6, said control electrode is disposed across an electron current flowing from said emitter layer to said collecting electrode.

* * * * *